US008563395B2

(12) United States Patent
Mi

(10) Patent No.: US 8,563,395 B2
(45) Date of Patent: Oct. 22, 2013

(54) METHOD OF GROWING UNIFORM SEMICONDUCTOR NANOWIRES WITHOUT FOREIGN METAL CATALYST AND DEVICES THEREOF

(75) Inventor: Zetian Mi, LaSalle (CA)

(73) Assignee: The Royal Institute For The Advancement of Learning/McGill University, Montreal (CA)

( * ) Notice: Subject to any disclaimer, the term of this patent is extended or adjusted under 35 U.S.C. 154(b) by 410 days.

(21) Appl. No.: 12/956,039

(22) Filed: Nov. 30, 2010

(65) Prior Publication Data

US 2011/0127490 A1    Jun. 2, 2011

Related U.S. Application Data

(60) Provisional application No. 61/264,905, filed on Nov. 30, 2009.

(51) Int. Cl.
*H01L 21/76* (2006.01)

(52) U.S. Cl.
USPC .............. 438/438; 257/E21.108; 977/816

(58) Field of Classification Search
USPC .............. 438/438; 257/321.108; 977/816
See application file for complete search history.

(56) References Cited

U.S. PATENT DOCUMENTS

| | | | |
|---|---|---|---|
| 6,831,017 B1 | 12/2004 | Li | |
| 6,996,147 B2 | 2/2006 | Majundar | |
| 7,211,464 B2 | 5/2007 | Lieber | |
| 7,335,908 B2 | 2/2008 | Samuelson | |
| 7,344,961 B2 | 3/2008 | Romano | |
| 7,354,850 B2 | 4/2008 | Selfert | |
| 7,432,522 B2 | 10/2008 | Samuelson | |
| 7,569,847 B2 | 8/2009 | Majundar | |
| 7,608,147 B2 | 10/2009 | Samuelson | |
| 7,682,943 B2 | 3/2010 | Samuelson | |
| 7,771,689 B2 | 8/2010 | Sunkara | |
| 7,829,443 B2 | 11/2010 | Selfert | |
| 2001/0017973 A1* | 8/2001 | Abe | ................ 386/52 |
| 2008/0194085 A1* | 8/2008 | Sunkara et al. | ........... 438/488 |

OTHER PUBLICATIONS

R. Calarco et al in "GaN and InN Nanorwires Grown by MBE: A Comparison", Appl. Phys. A, vol. 87, pp. 499-503.
C.H. Liang "Selective-Area Growth of Indium Nitride Nanowires on Gold Patterned Si(100) Substrates" Appl. Phys. Lett., vol. 81, No. 22, p. 1490636.

* cited by examiner

*Primary Examiner* — Trung Q Dang
(74) *Attorney, Agent, or Firm* — The Law Office of Michael E. Kondoudis

(57) ABSTRACT

Amongst the candidates for very high efficiency solid state lights sources and full solar spectrum solar cells are devices based upon InGaN nanowires. Additionally these nanowires typically require heterostructures, quantum dots, etc which all place requirements for these structures to be grown with relatively few defects. Further manufacturing requirements demand reproducible nanowire diameter, length etc to allow these nanowires to be embedded within device structures. Additionally flexibility according to the device design requires that the nanowire at the substrate may be either InN or GaN. According to the invention a method of growing relatively defect free nanowires and associated structures for group III—nitrides is presented without the requirement for foreign metal catalysts and overcoming the non-uniform growth of prior art non-catalyst growth techniques. The technique also allows for unique dot-within-a-dot nanowire structures.

12 Claims, 17 Drawing Sheets

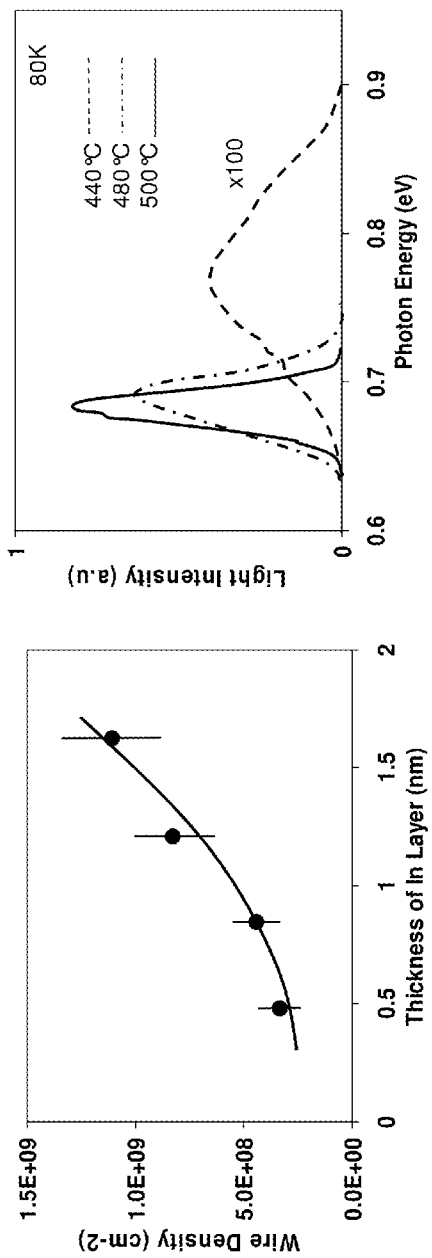
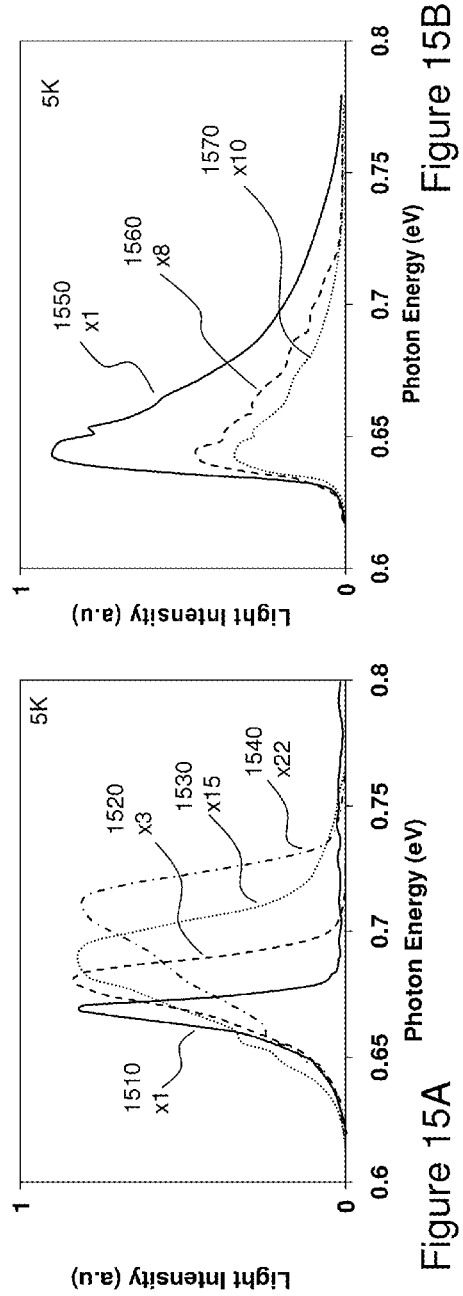
Figure 4I
Figure 15B
Figure 4H
Figure 15A

METHOD OF GROWING UNIFORM SEMICONDUCTOR NANOWIRES WITHOUT FOREIGN METAL CATALYST AND DEVICES THEREOF

CROSS-REFERENCE TO RELATED APPLICATIONS

This patent application claims the benefit of U.S. Provisional Patent Application 61/264,905 filed Nov. 30, 2009 entitled "Method of Growing Uniform Semiconductor Nanowires without Foreign Metal Catalyst and Devices Thereof."

FIELD OF THE INVENTION

This invention relates to semiconductor nanowires and more specifically to a method of growth without a foreign metal catalyst and devices incorporating them thereof.

BACKGROUND OF THE INVENTION

The ability to generate and manipulate light with electricity by Sir Humphrey Davy 200 years ago sparked a century of development by the likes of Thomas Edison, Joseph Swan, Sandor Just (tungsten filaments), and Irving Langmuir (inert gas instead of vacuum) leading to the establishment 100 years ago of tungsten filament lamps, which as the dominant light source have fundamentally shifted how people live, work, play. However, the efficiency of such light sources is woefully low. For example a 60 W incandescent light is only 2.1% efficient, a quartz halogen only 3.5%, in terms of generating light within the visible spectrum of the human eye. Accordingly today there is a massive worldwide campaign to have incandescent lights replaced wherever possible by compact fluorescent lights (CFL) which have an efficiency of approximately 22% thereby reducing energy consumption significantly.

However, whilst CFLs provide an immediate and visible statement by Governments and other organizations worldwide that they are addressing global climate change, environmental issues etc they are not a panacea. Amongst the disadvantages of fluorescent lights are frequent switching limiting lifetime, health and safety from the mercury content, UV emissions which affect some materials, flicker affecting individuals with autism, epilepsy, lupus, chronic fatigue syndrome, and vertigo, radio interference, operating temperature where efficiency drops with increasing/decreasing temperature from room temperature, non-operation at below freezing, low-luminance requiring long tubes and limiting power output, dimming, and recycling through the phosphor and mercury.

However, a monochromatic solid state light source within the visible wavelength range can achieve in principle an efficiency approaching 100%. Additional to energy consumption such solid state light sources should also reduce consumption of precious metals, reduce recycling as well as address health and safety issues. Beneficially solid state light sources by virtue of their small size, low weight, and low voltage operation can also be employed in a wide range of situations where incandescent or CFL lights cannot. At present niche applications such as holiday decorations in conjunction with indicator lighting in panels, back lighting in LCD displays etc mean that solid state lighting sales today account for only approximately 2% of the current lighting market and will grow to only approximately 3% in 2011.

Despite this solid state lighting is a massive market which according to NextGen Research ("LEDs and Laser Diodes: Solid State Lighting Applications, Technologies, and Market Opportunities", February 2009, http://www.nextgenresearch.com/research/1001995-LEDs_and_Laser_Diodes) forecasts the overall solid-state lighting (SSL) market will achieve worldwide revenues topping $33 billion by 2013. The illumination segment of the LED market will see compound annual growth rate (CAGR) of nearly 22% in the 2009-2013 timeframe as cities worldwide shift their streetlights to these more energy-efficient and ecologically friendly solutions. However, the majority of this growth will be generated from niche lighting applications including architectural, task lighting, medical and off-grid lighting applications rather than the residential lighting market according to The Strategy Analytics ("LED Device and Material Market Trends", June 2009, http://www.strategyanalytics.com/default.aspx?mod=ReportAbstractViewer&a0=4788).

As such the majority of the lighting market remains inaccessible despite the considerable research effort and investment have been expended. This arises due to the challenges in realizing suitable LED technologies and devices using conventional quantum well structures, these including the relatively low internal quantum efficiency of these structures, the low light extraction efficiency realized, and relatively high device fabrication costs. Additionally to achieve a "white" LED today the devices will generally employ a phosphor-conversion scheme, which sets the ultimate quantum efficiency of white LEDs to below 65%. In this regard, the high luminescence efficiencies, low fabrication costs, and processibility of semiconductor nanostructures, including quantum dots and nanowires, have made them promising candidates for future lighting devices and the subject of considerable research and development.

With the recent discovery that the band gap of indium nitride (InN) at approximately 0.7-0.8 eV, see for example J. Yu et al in "Unusual Properties of the Fundamental Band Gap of InN," (Appl. Phys. Lett., Vol. 80, pp. 4741, 2002) and T. Matsuoka in "Optical Bandgap Energy of Wurtzite InN" (Appl. Phys. Lett., Vol. 81, pp. 1246 (2002)), the epitaxial growth and characterization of InN nanowires and whiskers has become the focus of significant research, including for example T. Stoica et al in "MBE Growth Optimization of InN Nanowires" (J. Crystal Growth, Vol. 290, pp. 241, 2006), R. Calarco et al in "GaN and InN Nanowires Grown by MBE: A Comparison" (Appl. Phys. A, Vol. 87, pp 499-503), C-Y Chang et al in "Electrical Transport Properties of Single GaN and InN Nanowires" (J. Elect. Materials, Vol. 35, No. 4, pp. 738 2006), F. Werner et al "Electrical Conductivity of InN Nanowires and the Influence of the Native Indium Oxide Formed at Their Surface" (Nano. Lett. Vol. 9, No. 4, pp 1567-1571, 2009) and J. Grandal et al "Accommodation Mechanism of InN Nanocolumns Grown on Si (111) Substrates by Molecular Beam Epitaxy" (Appl. Phys. Lett., Vol. 91).

When compared to other nitrides with group III elements including aluminum, gallium and boron, InN exhibits the highest electron mobility (4400 $cm^2V^{-1}s^{-1}$ at 300 K), the smallest effective mass, and the highest saturation velocity. These properties make InN an excellent candidate for next generation of nanophotonic and nanoelectronic devices, including chip level nanoscale lasers and high-speed field effect transistors. Additionally, the band gap of InN at approximately 0.7 eV (1750 nm) when compared with GaN at approximately 3.3 eV (370 nm) means that the ternary alloy InGaN can be continuously tuned from ~0.7 to 3.3 eV, matching almost perfectly to the solar spectrum Therefore, InGaN has also emerged as a promising material for future high-efficiency full solar spectrum solar cells, E. Trybus et al "InN: A Material with Photovoltaic Promise and Challenges" (*J. Crystal Growth*, Vol. 288, No. 2, pp. 218-224, 2006) as well as for light sources (LEDs).

It should be apparent to one skilled in the art that in order to provide a full solar spectrum solar cell it should be structured so that the material at the front of the solar cell absorbs the shortest wavelengths and progressively longer wavelengths are absorbed by layers within the solar cell towards the lower most surface. As such, the material within a full solar spectrum solar cell should grade from $In_xGa_{1-x}N$ where $x\approx 1$ to $In_yGa_{1-y}N$ where $y\approx 0$. As such it is necessary to grow InN nanowires onto the substrate of the solar cell.

Within the prior art InN nanowires have been predominantly grown using the conventional approach of a foreign metal catalyst via the vapor-liquid-solid growth mechanism, see for example J. Li et al in U.S. Pat. No. 6,831,017 entitled "Catalyst Patterning for Nanowire Devices", L. Romano et al in U.S. Pat. No. 7,344,961 entitled "Methods for Nanowire Growth", C. Liang et al in "Selective-Area Growth of Indium Nitride Nanowires on Gold-Patterned Si(100) Substrates" (Appl. Phys. Lett., Vol. 81, 22 (2002) and X. Cai et al in "Straight and Helical InGaN Core-shell Nanowires with a High In Core Content" (Nanotechnology, Vol. 17, pp 2330-2333, 2006). They have also been formed spontaneously under nitrogen rich conditions; see for example C-K Chao et al "Catalyst Free Growth of Indium Nitride Nanorods by Chemical Beam Epitaxy" (Appl. Phys. Lett., Vol. 88) and S. Hersee et al in U.S. Pat. No. 7,521,274 entitled "Pulsed Growth of Catalyst-Free Growth of GaN Nanowires and Application in Group III Nitride Semiconductor Bulk Material."

Whilst the influence of growth parameters on the structural and optical properties of InN nanowires has also been extensively studied. epitaxial InN nanowires grown according to the prior art exhibit tapered morphology, with a large variation in the wire diameter along the wire length, see for example T. Stoica et al in "MBE Growth Optimization of InN Nanowires" (J. Crystal Growth, Vol. 290, pp. 241, 2006) and J. Grandal et al "Accommodation Mechanism of InN Nanocolumns Grown on Si (111) Substrates by Molecular Beam Epitaxy" (Appl. Phys. Lett., Vol. 91), and demonstrated spectral linewidths for these InN nanowires are commonly in the range of 60-100 meV. The extremely large inhomogeneous broadening observed makes it difficult to study the fundamental properties of InN, including the temperature dependence of the band gap and the electron concentration. Additionally, the poorly defined wire geometry leads to uncontrolled electrical and optical properties, severely limiting their device applications.

Further the direct growth of InN on silicon, the most suitable substrate for InN in terms of lattice and thermal mismatches, has been further complicated by the development of an amorphous $SiN_x$ layer during the initial stage of growth, see J. Grandal et al. Attempts to adjust these growth techniques, either by the intentional introduction of hydrogen or buffer layers, such as GaN or AlN, have met with limited success.

The prior art whilst demonstrating InN nanowires can be grown has not yet demonstrated them with high quality and constant cross-section nor have they been grown on suitable substrates for low cost semiconductor processing. These developments to date being hindered to a large extent by the relatively low decomposition temperature of InN (approximately 500° C.-550°) as well as the very high migration rate of indium. Additionally, the prior art does not provide an effective means to control the growth and properties of InN nanowires spontaneously formed under nitrogen rich conditions.

Accordingly it would be beneficial to provide a means of growing high quality, uniform InN nanowires directly upon silicon substrates without the requirement for predeposition of a catalyst. It would be of further benefit for the growth rate and properties of the InN nanowires to be controlled through the parameters of the growth process and for the growth to continue despite the growth of the $SiN_x$ layer.

As discussed supra graded InGaN nanowire structures would allow full solar spectrum solar cells to be implemented with a single growth process thereby greatly increasing the efficiency of solar cells and reducing their costs. However, for solid state lighting applications the ultimate goal is a high efficiency white LED. However, according to the prior art simple LED structures whilst offering a fairly broad wavelength range operate at relatively low efficiencies and typically three LED devices are required to even cover a substantial portion of the wavelength range to which the human eye responds, the so-called visible wavelength range, which is 380 nm to 750 nm. As such red, green and blue centered LED devices are typically used to create the impression of white. Blue LEDs were the last to be developed based upon InGaN structures. These blue LEDs also form the basis of phosphor based white LEDs. However, increasing the efficiency of LEDs by the introduction of quantum confined structures, such as quantum wells, multi-quantum wells etc also results in a narrowing of the optical emission from the source thereby requiring that number of sources required to "blend" together for the desired white light increases.

It is within this context that semiconductor quantum dots, nanometer sized semiconductor particles which act as a very small "box" for electrons, and potentially the most efficient light sources ever developed have formed the subject of significant research. A specific class of quantum dot is the colloidal quantum dot created by solution phase chemistry. Much of the appeal of the colloidal quantum dot is that it can be readily integrated with other technology platforms at very low cost and that by varying the physical dimensions of the quantum dots they can be made to emit at points across the entire visible spectrum. Accordingly providing colloidal quantum dots with a range of dimensions within the same localized region acts to provide the required multiple sources to "blend" together to provide the illusion of a white light source. Recent work by R. R. Cooney et al entitled "Gain Control in Semiconductor Quantum Dots via State-Resolved Optical Pumping" (Phys. Rev. Lett., Vol. 102, No. 12, 2009) has shown that quantum dots are in fact the most efficient material for generating gain ever measured. The use of quantum dots as white light emitters and in LEDs has also been proposed and demonstrated, see for example S. Sapra at al (Adv. Mater., Vol. 19, pp. 569, 2007), M. J. Bowers et al (J. Am. Chem. Soc., Vol. 127, 2005), S. Coe et al (Nature, Vol. 420, pp. 800 2002), N. Tessler et al (Science, Vol. 295, pp. 1506, 2002), and M. C. Schlamp et al (J. Appl. Phys., Vol. 82, 1997).

However, whilst colloidal quantum dots are themselves efficient an optical emitter employing them can only be efficient if the colloidal quantum dots are optically pumped with an efficient emitter at the appropriate wavelength. As noted supra InGaN nanowire structures can form the basis for very high efficiency emitters which cover the wavelength range from near UV (370 nm) to the near infra-red (1750 nm).

Accordingly it would be beneficial to provide a combination of colloidal quantum dots with the high quality, uniform InGaN nanowires that are grown directly upon silicon substrates without the requirement for predeposition of a catalyst. Such a combination beneficially combines high efficiency InGaN based nanowire LEDs for pumping highly efficient colloidal quantum dot emitters which when formed from multiple dimensions yield emission across the visible spectrum, thereby providing a high efficiency "white" LED.

To date significant progress has been made in demonstrating blue and blue-green LEDs using InGaN to form the third LED within a red-green-blue combination (RGB) approach to forming a white LED. LEDs for the remainder of the RGB combination being manufactured from typically AlGaInP and GaAsP based quaternary semiconductor systems for yellow-orange LEDs and GaAsP and AlGaAs for red LEDs. However, as noted supra InGaN allows bandgap tuning across the visible spectrum and into the UV/infrared. Within the prior art InGaN/GaN LEDs have exhibited very low internal quantum efficiencies in the green, yellow and red wavelength ranges, see for example P. T. Barletta et al (Appl. Phys. Lett., Vol. 90, 2007) and C. Wetzel et al (MRS Internet J. Nitride Semicond. Res., Vol. 10, No. 2, 2005). One of the primary causes for this low efficiency is the strain-induced polarization field in InGaN/GaN quantum wells and the resulting quantum confined Stark effect, which leads to a spatial charge separation.

In this regard, InGaN/GaN quantum dot heterostructures have drawn considerable attention, see for example K. Tachibana et al (IEEE J. Sel. Top. Quantum, No. 6, 475 2000), N. Grandjean et al (Proc. IEEE, Vol. 95, pp. 1853, 2007) and Q. Wang et al (Appl. Phys. Lett., Vol. 93, 2008). This is based upon their providing strong carrier confinement and being identified, although with some debate, as the emission mechanism for the high efficiency InGaN blue and blue-green LEDs and lasers. However, to date three-dimensional InGaN/GaN quantum dot heterostructures obtained by self-organization using Stranski-Krastanow growth or phase segregation induced. In-rich clusters have yielded similar results to bulk planar InGaN/GaN quantum well heterostructures. As such high efficiency long wavelength (>550 nm) emission has been severely limited by the presence of large densities of misfit-dislocations related to the large lattice mismatch (~11%) between InN and GaN. However, significantly reduced defect densities can be achieved in InGaN nanowire heterostructures, due to the effective lateral strain relaxation, see Y. Chang et al in "Molecular Beam Epitaxial Growth and Characterization of Non-Tapered InN Nanowires on Si(111)" (Nanotechnology, Vol. 20, 2009). This reduced strain distribution also leads to a weaker piezoelectric polarization field.

As noted supra InGaN nanowires offer advantages for LED manufacturing, including high light extraction efficiency and the compatibility with low cost, large area Si substrates, see Y. Chang et al, and can form the basis of either discrete LEDs or LED based white LEDs in combination with colloidal quantum dots. However, to date such nanowire structures have reported extremely low internal quantum efficiency (<10%), due to the lack of effective carrier confinement in the wire axial direction as well as the nonradiative recombination associated with the presence of surface states. However, with the ability to form nearly defect-free InGaN nanowires as discussed supra then it is proposed that InGaN quantum dots directly embedded in InGaN nanowires would provide a route to realizing high efficiency green and red emission sources. Within the prior art no such nanoscale heterostructures have been reported.

According to embodiments of the invention based upon the ability to form defect-free InGaN nanowires directly onto silicon substrates without foreign metal catalysts it would be beneficial to modify the growth process such that nearly defect-free InGaN/GaN dot-in-a-wire heterostructures on silicon could be implemented. Further, by varying the growth parameters to adjust the In composition within the InGaN quantum dots these high efficiency optical emitters (~45%) may be beneficially tuned to emit within the green, yellow, and amber/red regions of the visible spectrum to compliment the already existing blue and blue-green emission sources. Beneficially the nearly defect-free growth permits the formation of In-rich nanoclusters to form through phase separation within the InGaN quantum dot, such that these high efficiency optical emitters are further implemented by a unique dot-within-a-dot-in-a-wire structure rather than a prior art dot-in-a-wire approach.

Accordingly it would be beneficial to provide a combine multiple quantum dots with the high quality, uniform InGaN nanowires that are grown directly upon silicon substrates without the requirement for predeposition of a catalyst. Such a combination beneficially provides for InGaN/GaN dot-within-a-dot based nanowire optical emitters allowing LEDs with high efficiency to be implemented across the entire visible spectrum.

According to embodiments of the invention therefore high efficiency LEDs for generating high efficiency solid state white light sources can be manufactured based upon forming nanowires using a nearly-defect free InN process upon silicon substrates that does not require a foreign metal catalyst to be introduced or complex precursor gas control processes to achieve growth which would be incompatible with forming either quantum dot in a wire structures or the quantum dot within a quantum dot within a wire structures for increased efficiency.

SUMMARY OF THE INVENTION

It is an object of the present invention to obviate or mitigate at least one disadvantage of the prior art.

In accordance with an embodiment of the invention there is provided a method comprising:

providing a first source of a plurality of sources, the first source of the plurality of sources for providing a source of a group III element;

providing a second source of the plurality of sources, the second source of the plurality of sources for providing a source of nitrogen;

providing a substrate within a reaction chamber, the reaction chamber comprising at least controllable inlets for at least the first and second sources of the plurality of sources;

establishing operation of the reaction chamber at a first predetermined set of operating conditions;

introducing the first source of the plurality of sources into the reaction chamber in the absence of the second source for a first predetermined period of time, the introduction being at least one of at a predetermined flow rate and predetermined pressure;

establishing operation of the reaction chamber at a second predetermined set of operating conditions after the predetermined period of time has elapsed;

introducing into the reaction chamber in addition to the first source of the plurality of sources at least the second source of the plurality of sources, each of the first and second sources of the plurality of sources being introduced at least one of at a predetermined flow rate and a predetermined pressure;

operating the reaction chamber at the second predetermined set of operating conditions for a second predetermined period of time.

In accordance with another embodiment of the invention there is provided a method comprising initiating the growth of a wurtzite semiconductor onto a substrate, the initiation being achieved through providing nanoscale droplets of a group III element constituent of the wurtzite semiconductor on the surface of the substrate and absent both a foreign catalyst and other constituent elements of the wurtzite semiconductor.

In accordance with another embodiment of the invention there is provided a device comprising a substrate having at least one semiconductor structure of a plurality of semiconductor structures formed thereupon, the at least one semiconductor structure comprising a first predetermined portion formed from a wurtzite semiconductor whose growth was initiated by providing nanoscale droplets of a group III element constituent of the wurtzite semiconductor on the surface of the substrate and absent both a foreign catalyst and other constituent elements of the wurtzite semiconductor.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 4H shows the variation in InN nanowire density versus In seeding layer thickness according to an embodiment of the invention;

FIG. 4I shows the photoluminescence emission spectra for samples at varying growth temperature according to an embodiment of the invention;

FIGS. 15A and 15B depict photoluminescence spectra for Si and Mg doped InN Nanowires according to embodiments of the invention;

DETAILED DESCRIPTION

The present invention is directed to the growth of InGaN nanowires and devices thereof for high efficiency solid state light sources.

Reference may be made below to specific elements, numbered in accordance with the attached figures. The discussion below should be taken to be exemplary in nature, and not as limiting of the scope of the present invention. The scope of the present invention is defined in the claims, and should not be considered as limited by the implementation details described below, which as one skilled in the art will appreciate, can be modified by replacing elements with equivalent functional elements.

Figure 1:
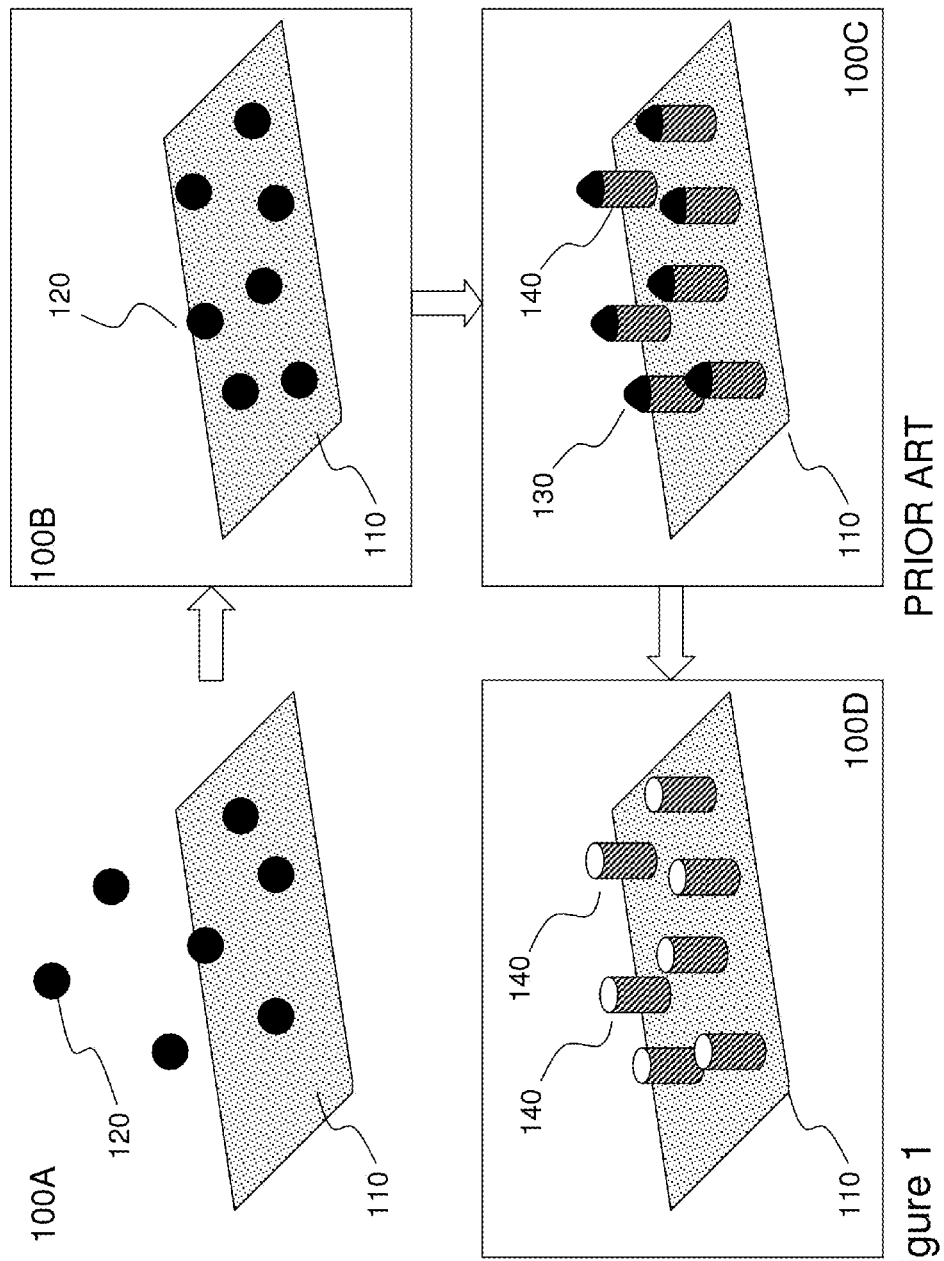
FIG. 1 is schematic sequence of growing nanowires according to the prior art with a foreign metal catalyst.

Referring to FIG. 1 there is shown a sequence of growing nanowires according to the prior art with a foreign metal catalyst. Such prior art using the vapor-liquid-solid (VLS) growth mechanism including for example J. Li et al in U.S. Pat. No. 6,831,017 entitled "Catalyst Patterning for Nanowire Devices", L. Romano et al in U.S. Pat. No. 7,344,961 entitled "Methods for Nanowire Growth", C. Liang et al in "Selective-Area Growth of Indium Nitride Nanowires on Gold-Patterned Si(100) Substrates" (Appl. Phys. Lett., Vol. 81, 22 (2002) and X. Cai et al in "Straight and Helical InGaN Core-shell Nanowires with a High In Core Content" (Nanotechnology, Vol. 17, pp 2330-2333, 2006).

As shown in first step 100A a substrate 110 is disposed within a deposition environment wherein catalyst microparticles 120 are present, for example gold microparticles. Accordingly at second step 100B some of these catalyst microparticles 120 have deposited onto the substrate 110. The resultant combination of substrate 110 and microparticles 120 are then placed within a semiconductor growth reactor, for example a molecular beam epitaxy reactor (MBE), wherein the requisite precursor gases are introduced under conditions of predetermined power, temperature, pressure etc. The result is these precursors are disassociated within the semiconductor growth reactor and the active species of interest, for example indium (In), gallium (Ga) and nitrogen (N) are then present in a vapor state. These active species then condense onto the substrate 110 in the presence of the gold microparticles 120 forming a liquid phase which subsequently solidifies with the gold migrating to the upper surface of the structure as it solidifies so-called vapour-liquid-solid (VLS) growth. Accordingly a nanowire grows at the locations of the original gold microparticles 120 as shown in third step 100C wherein nanowires 140 are formed beneath gold 130 upon the substrate 110. Upon expiration of a predetermined period of time, governed by nanowire growth rate and desired nanowire length, the reaction is terminated. Then at fourth step 100D the gold 130 is etched away leaving the nanowires 140 upon the substrate.

Within the prior art other approaches for providing the metal catalyst, other than depositing gold microparticles 120 have been described, see for example J. Li et al in U.S. Pat. No. 6,831,017 entitled "Catalyst Patterning for Nanowire Devices", which include metallization and etching after photolithography, metallization onto substrates with predefined photolithographic pattern and subsequent lift-off, melting deposited metallization, evaporating through porous spheres etc. Alternative catalysts within the prior art also include iron (Fe) and nickel (Ni).

Figure 2A:
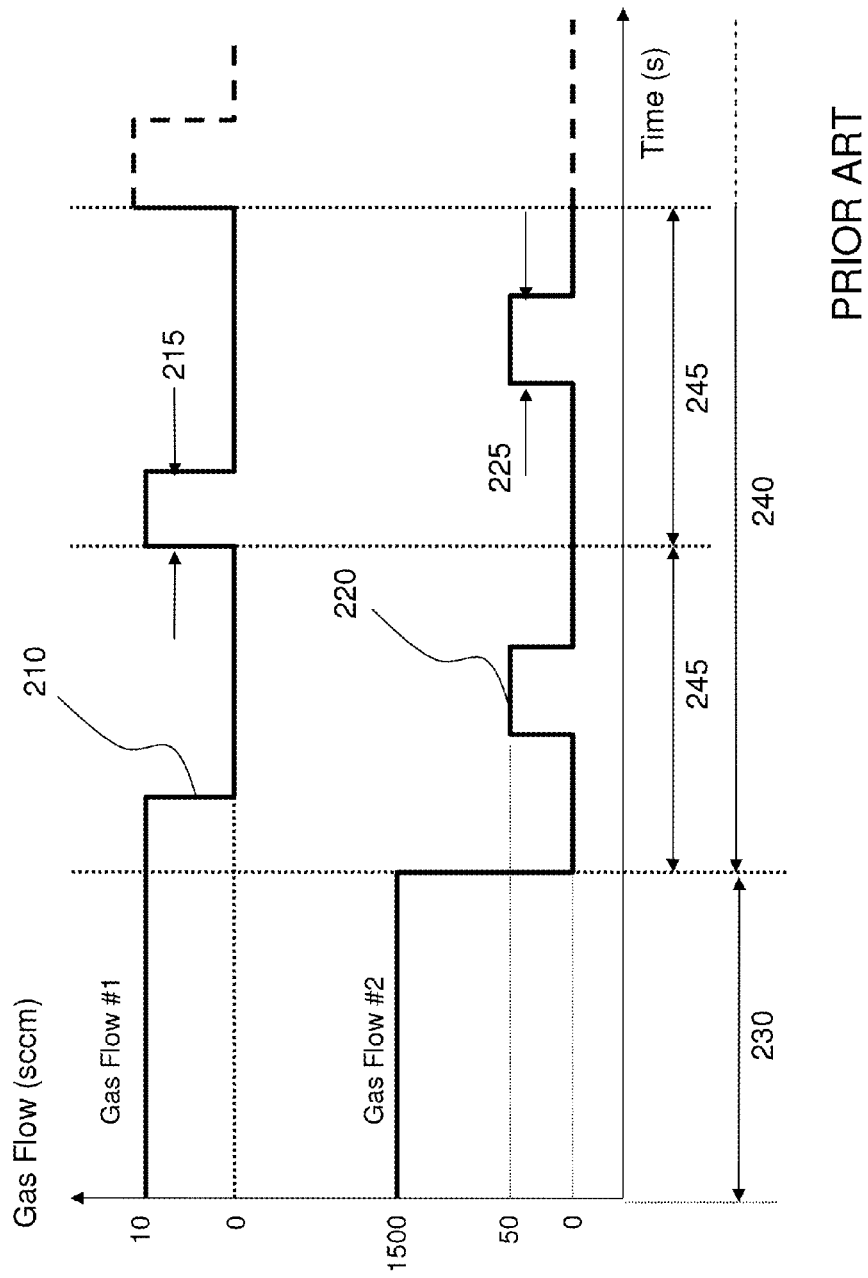
FIG. 2A is a schematic of the gas flows for growing nanowires according to the prior art without a foreign metal catalyst.

However, these prior art VLS growth based nanowires exhibit problems as the catalytic processes cannot control the uniformity of the resulting nanowires and the catalyst is inevitably incorporated into the nanowires to some degree, thereby degrading the crystalline quality of the nanowires, wherein the introduced defects result in limits to their performance and applications. Accordingly within the prior art there are also approaches to growing nanowires that relate to the spontaneous formation of growth points for nanowires under nitrogen rich environments, thereby removing the requirement for a foreign metal catalyst. Such an example of the gas control for such a prior art growth approach is shown in FIG. 2A according to the prior art of S. Hersee et al in U.S. Pat. No. 7,521,274 entitled "Pulsed Growth of Catalyst-Free Growth of GaN Nanowires and Application in Group III Nitride Semiconductor Bulk Material.".

Accordingly there are shown gas flow curves for two gases in the growth of a nanowire, for example gallium nitride (GaN). Accordingly first curve 210 plots the gas flow of the first precursor gas for Ga, namely trimethylgallium (TMGa), versus time. Second curve 220 plots the gas flow of the second precursor gas, ammonia ($NH_3$). During a first continuous growth regime 230 both precursor gases are present within the reactor with an effective N:Ga ratio of 150. During this continuous growth period 230 nanowires are spontaneously formed upon a buffer layer on the substrate, the buffer layer for example being a group III-N alloy including for example GaN, AlN, InN, InGaN. Subsequently the growth enters a pulsed growth regime 240 wherein the gases are intermittently introduced into the reaction chamber with a periodic sequence 245. For example Hersee teaches that the first duration 215 for the first precursor gas TMGa is typically 10–20 seconds whilst second duration 225 for the second precursor gas $NH_3$ is typically 15-30s. Accordingly typical duration for the periodic sequence is 60-90 seconds. Further as evident from second curve 220 the N:Ga ratio is reduced to about 50 within this example. Accordingly continuous growth regime 230 corresponds to a nitrogen rich atmosphere in comparison to the pulsed growth regime 240.

However, Hersee notes that the growth behavior of the nanowire is changed significantly for even small molecular fractions of an additional precursor gas, such as trimethylaluminum (TMAl) for aluminum and trimethylindium (TMIn) for indium, at even percentages as low as 1%, such that nanowire cross-sections change, growth rates shift, etc. Given that the growth of full solar spectrum solar cells would require the $In_xGa_{1-x}N$ composition within a nanowire to change from approximately x=0.00 to approximately x=1.00, namely a molecular fraction change of 100%, and even shifting from a blue light source (x=0.30) to a green light source (x=0.43) requires a molecular fraction change of approximately 13% it is evident that significant issues arise in forming nanowires with varying composition as required for graded nanowires or nanowires with embedded quantum wells. Additionally these varying growths during formation of a nanowire result in increased defects thereby reducing their efficiency and applications. Similarly Hersee teaches that the nanowires grow with a cross-section determined by the selective area mask patterned onto the buffer layer rather than being determined from the process conditions of the reactor. It is also important to note that the growth mode of Hersee was based upon GaN nanowires and not InN nanowires which are the focus of this invention as the rapid lateral growth variations evident from even minor compositional changes would significantly impact the growth of InN nanowires.

Figure 2B:
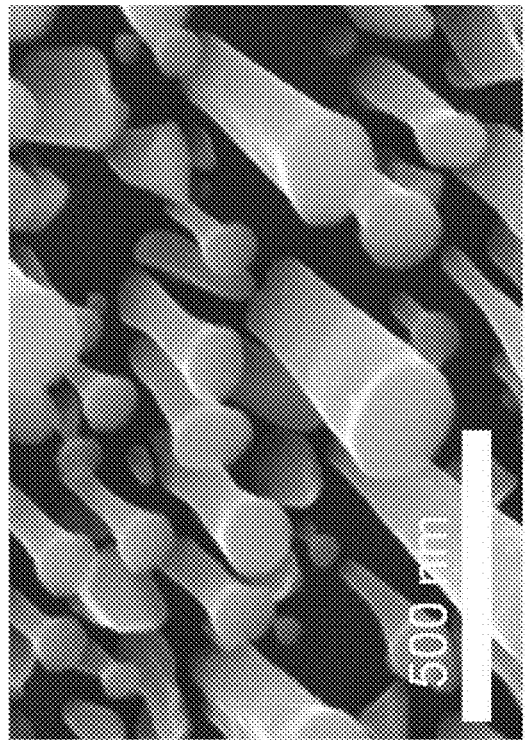
FIG. 2B is a SEM micrograph of InN nanowires grown according to the prior art.

Referring to FIG. 2B there is shown an SEM micrograph of InN nanowires grown using a continuous growth upon a silicon substrate without application of a selective area growth mask. As is evident the InN wires have grown not only at different rates, implying that nucleation occurred at different times within the process but that their geometries are not uniform. Accordingly it is believed that the approach of Hersee demonstrated with patterning of the buffer layer at dimensions of ~150 nm would not work at smaller dimensions as nucleation may or may not occur within the short continuous mode growth before pulsed growth mode is required to maintain the nanowire growth process.

Figure 3:
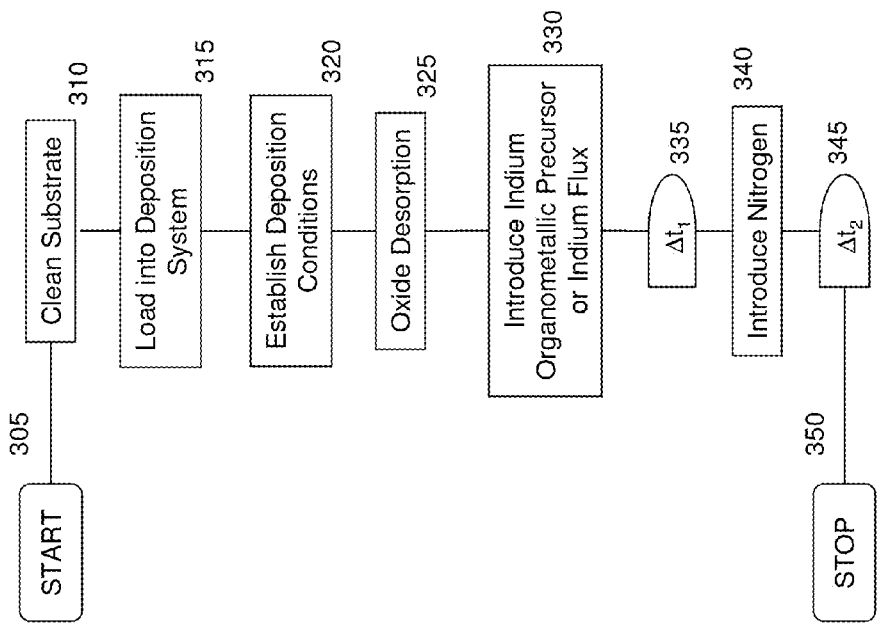
FIG. 3 is an exemplary process flow for growing InN nanowires according to an embodiment of the invention.

Referring to FIG. 3 there is shown an exemplary process according to an embodiment of the invention for growing InN nanowires onto silicon (of orientation <111>) substrates using a Veeco Gen II MBE system equipped with a radio frequency (RF) plasma source. The process starts at step 305 and moves to step 310 wherein the silicon (Si) wafer is cleaned, in this case by an ex situ clean using standard solvent and buffer hydrofluoric acid solution, before the process moves to step 315 and the Si wafer is loaded into the MBE chamber. Next, in step 320, the deposition parameters for the nanowire growth are established, determined by the composition of the nanowire, inclusion of quantum dots, quantum wells, etc as well as physical parameters such as nanowire length. Subsequently in step 325 an in situ oxide desorption at elevated temperatures (~770° C.) is performed together with a degassing procedure (~850° C. for 10 minutes), the result of which is that a 7×7 reflection high energy electron diffraction (RHEED) pattern can be clearly observed as evident from first insert 370.

Next in step 330 the substrate temperature is lowered, typically between 430° C. and 520° C. for the growth of InN nanowires and the indium organometallic precursor or indium beam flux is introduced, i.e. TMIn or In respectively, and the reactor operates for a first predetermined period of time $\Delta t_1$ in step 335 in order to deposit a thin In layer, of thickness typically between 0.5 nm and 1.6 nm (representing typically 10 to 30 seconds of processing). Next in step 340 the nitrogen precursor, ammonia, is introduced and the process moves to step 345, wherein the substrate temperature is raised to 480° C. and the process continues to execute for a second predetermined period of time $\Delta t_2$ before the process terminates at step 350. The growth period $\Delta t_2$ ranged from 30 minutes to 10 hours within experiments performed.

Additionally, the formation and properties of InN nanowires under different growth conditions have been evaluated. Typical process ranges for InN nanowires include nitrogen flow rates between 1.0 sccm and 2.0 sccm, In partial pressure between $0.3\text{-}1.0\times10^{-7}$ Torr, growth temperature between 430° C. and 520° C., and RF plasma forward power between 300 W and 450 W.

Referring to FIGS. 4A through 4D there are shown SEM images taken at tilt angles of _45° for samples grown at 440° C., 460° C., 480° C., and 500° C., respectively are shown. The In flux was fixed at $1\times10^{-7}$ Torr for the four samples, and a 0.5 nm In seeding layer was deposited in situ prior to the growth initiation. It is evident that both the wire density and size vary considerably with the change in the growth temperature. At a relatively low growth temperature (~440° C.), the nanowires are generally coalesced together and exhibit a bimodal distribution in both height and diameter, shown in FIG. 4A. A further reduction in the growth temperature will lead to compact InN layers due to the reduced In thermal desorption. With the increase in the growth temperature, the wires become well spaced, the wire densities decrease considerably from ~100 μm-2 to ~1 μm-2, and the wire diameters increase from ~50 nm to ~200 nm, or larger in the temperature range of 440-500° C. The wire density and size are determined, to a large degree, by both the nucleation sites as well as the subsequent thermal-driven convalescence process during the initial stage of the wire formation. The properties of the nucleation sites, or In islands, are also strongly temperature dependent. At elevated substrate temperatures, conventional InN nanowires generally exhibit a severe enlargement of diameter toward the top due to a very high In migration rate. In contrast, InN nanowires grown at high temperatures ~460-500° C. according to embodiments of the invention are well faceted and highly homogeneous in height and, more importantly, exhibit completely suppressed tapering or broadening effect along the entire wire length, as shown in FIGS. 4A through 4D.

It can be seen that these wires are remarkably straight, with identical top and bottom sizes. They also exhibit homogeneous height. The wires are of wurtzite structure and well-separated, with the c-axis oriented vertically to the Si(111) substrate as commonly observed for III-nitride nanowires grown on Si(111), see for example C. Shen et al (Appl. Phys. Lett., Vol. 88, 2006) and Y. Lu et al (Appl. Phys. Lett., Vol. 91, 2007).

Figure 4B:
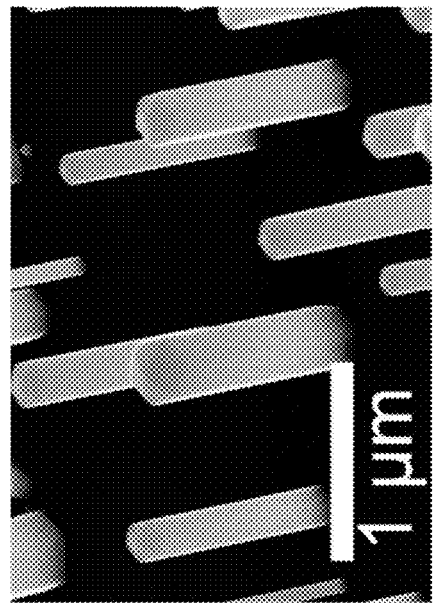
FIGS. 4A through 4D show SEM micrographs of InN nanowires grown according to an embodiment of the invention at varying growth temperature.
Figure 4D:
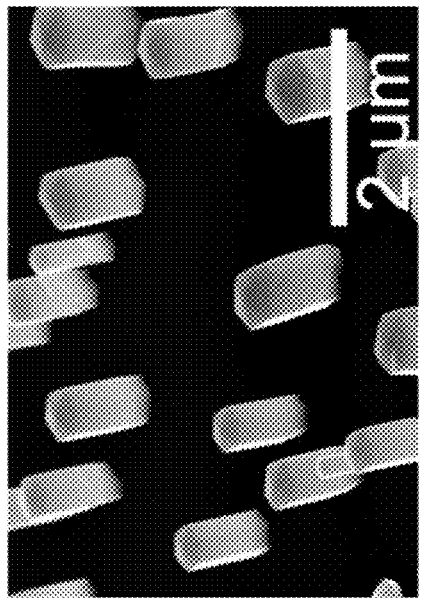

These should be compared with the InN nanowires of FIG. 2B which were grown in the same reactor without the thin In layer with the same substrate temperature of 480° C., In partial pressure of $1.0\times10^{-7}$, flow rate of 1.5 sccm, and growth time of ~2.5 hours. Referring to FIG. 4D the SEM image of an InN nanowires grown on Si at a slightly higher substrate temperature of ~500° C. is shown. These InN nanowires are also non-tapered, with a further reduced density but larger diameter. For comparison, conventional InN nanowires grown at such temperatures generally exhibit an inverse pyramid-like shape, with the wire top 2-5 times larger than the root; see for example T. Stoica et al in "MBE Growth Optimization of InN Nanowires" (J. Crystal Growth, Vol. 290, pp. 241, 2006).

To understand the role of the pre-deposited In layer on the achievement of non-tapered InN nanowires, it is important to note that the formation of InN nanowires may involve a self-catalytic process, as suggested by recent experiments including for example T. Kang et al (Appl. Phys. Lett, Vol. 89, 2006) and M. He et al (J. Vac. Sci. Technol. B, Vol. 25). However, unlike the prior processes within the embodiments of the invention the InN nanowires nucleate and grow from nanoscale In droplets created on the growing surface. During prior art spontaneous growth of InN nanowires, there are no well-defined nucleation centers, and, consequently, the continuously random nucleation of nanowires leads to InN nanowires on Si with a large variation in height and diameter. Also due to the large diffusion rate of In adatom and their preferential incorporation near the wire top, conventional InN nanowires generally exhibit severely tapered morphology, see for example T. Stoica et al in "MBE Growth Optimization of InN Nanowires" (J. Crystal Growth, Vol. 290, pp. 241, 2006). On the other hand, according to the invention, the in situ deposited In layer prior to growth initiation forms nanoscale liquid droplets on the Si surface at elevated temperatures, which can therefore act as seeds to promote the nucleation of InN nanowires. As a result, the nanowire density is largely predetermined, and the size uniformity is significantly enhanced.

Figure 4A:
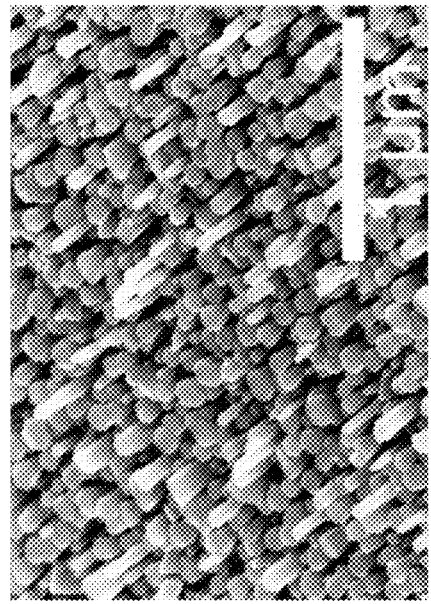
Figure 4C:
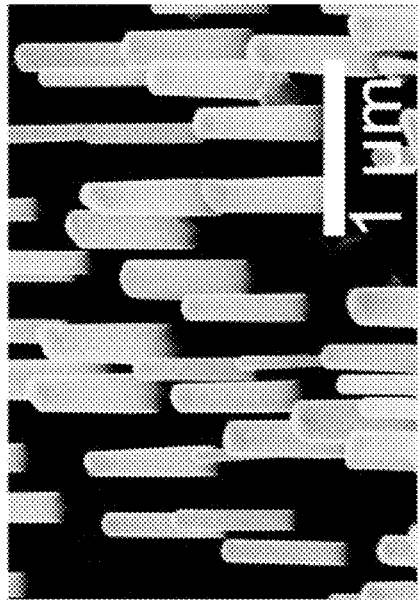

Nanowire growth is controlled by the quasi-equilibrium among the various dynamic processes, including adatom diffusion, desorption, and incorporation, as well as adatom impinging on the wire top. With well-defined wire densities, these dynamic processes can be tailored by optimizing the growth conditions, including In and nitrogen flux and RF plasma power, thereby leading to perfectly straight InN nanowires on Si, as illustrated in FIGS. 4A and 4B, that were not possible before according to the prior art. To achieve a better control over the properties of InN nanowires on Si and also further elucidate the role of the In seeding layer, InN nanowires on Si were grown using predeposited In layers with different thicknesses. It has been consistently observed that, with the increase of the In layer thickness from 0.5 nm to 1.6 nm, that the density of InN nanowires increases from ~4 $\mu m^{-2}$ to ~15 $\mu m^{-2}$, or higher. This can be explained by the presence of a larger density of nucleation centers related to a thicker In layer. In the prior art growth of spontaneously formed nanowires, control over the wire density is largely achieved by varying the growth temperature, which often makes it extremely difficult to optimize other properties of the wires, as they are directly related to the growth temperature as well. The use of an in situ deposited In seeding layer can therefore provide an additional dimension to effectively control the growth and properties of InN nanowires.

Figure 4F:
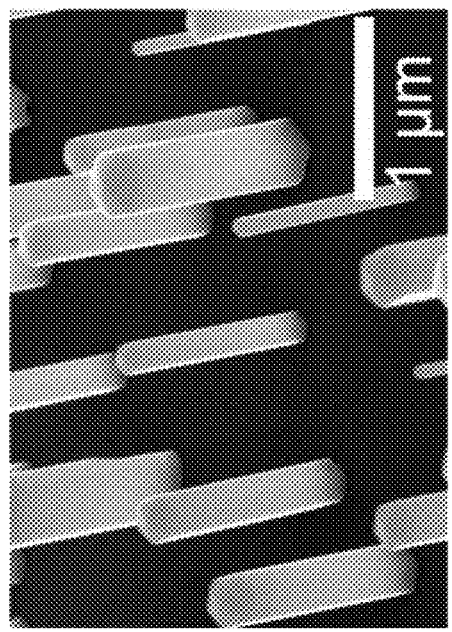
FIGS. 4E through 4G show SEM micrographs of InN nanowires grown according to an embodiment of the invention at varying In fluxes for constant growth temperature.
Figure 4E:
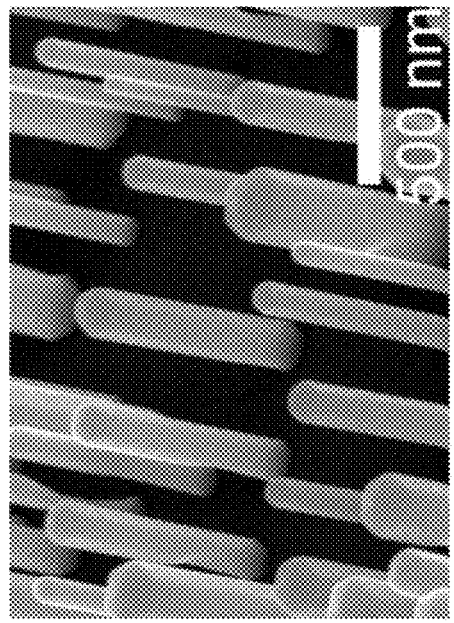
Figure 4G:
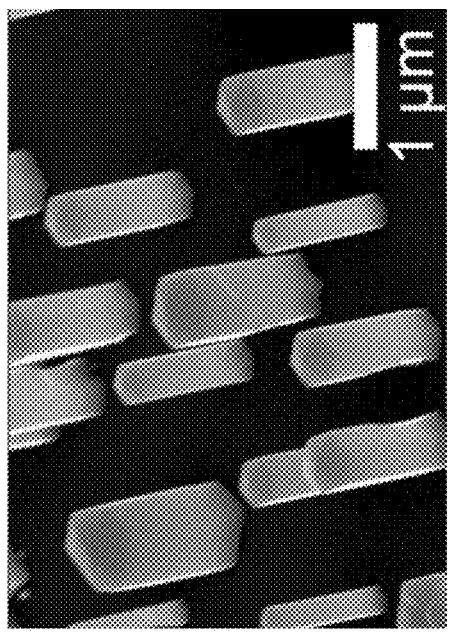

Next the effect of In flux on the structural properties of InN Nanowires is shown with reference to FIGS. 4E through 4G. The growth temperature was fixed at ~470° C., which is sufficiently high to yield well-separated nanowires. FIGS. 4E to 4G being SEM images taken at tilt angles of _45° for samples grown at In beam equivalent pressures (BEPs)_of $\sim2\times10^{-8}$, $\sim7\times10^{-8}$, and $\sim1.8\times10^{-7}$ Torr, respectively, which are well within the nitrogen-rich regime. It is observed that the wire diameters increase from ~100 nm to ~250 nm, or larger, with the increase in the In deposition rate, which is attributed to the enhanced In adatom migration and the subsequent incorporation on the wire lateral surfaces. Further increase in the In flux may eventually lead to the formation of compact InN layers. The wire densities are also reduced with the increase in the In deposition rate potentially due to the enhanced coalescence of smaller wires during the initial stage of wire growth when the nitrogen/In flux ratio is reduced. According to embodiments of the invention, with the variation in the In deposition rate, InN nanowires also exhibit completely nontapered morphology, which is in direct contrast to conventionally grown InN nanowires wherein variations in the In flux commonly induce a significant change in the ratio between the top and the bottom wire diameters.

Referring to FIG. 4H there is shown the variation in InN nanowire density versus In seeding layer thickness according to an embodiment of the invention. With the use of a thicker In seeding layer, higher densities of In islands can be formed on the substrate. Consequently, the presence of more In nucleation centers may potentially lead to the formation of a larger density of nanowires. Shown in FIG. 4H, with the increase in the In layer thickness from ~0.5 nm to ~1.6 nm, the wire density is increased from ~4×10+8 to ~1.3×10+9 cm-2, accordingly. The growth temperature and In flux were kept at _470° C. and 7_10–8 Torr, respectively. However, it is also important to note that the nucleation, formation, and evolution of InN nanowires are extremely complicated processes and may involve various dynamic processes that can be strongly influenced by other growth parameters as well. As a result, the presence of In islands and the subsequently grown InN nanowires may exhibit a highly nonlinear relationship, which can potentially be utilized to yield electronically pure InN nanowires with well controlled properties.

Referring to FIG. 4I there is shown photoluminescence emission spectra for samples at varying growth temperature according to an embodiment of the invention. FIG. 4H shows the PL emission spectra of samples grown at ~440° C., ~480° C., and ~500° C. at 80K under an excitation power of ~1.5 mW. The sample grown at ~440° C._exhibits a very low PL efficiency and a large spectral Linewidth (full width at half maximum (FWHM) of ~100 meV), with a PL peak position at ~0.75 eV. On the other hand, the samples grown at ~480° C. and ~500° C., respectively, display considerably higher PL efficiencies, significantly narrower spectral linewidths (FWHM of ~20 meV), and much smaller PL peak energies (~0.67 eV). We have further measured a very narrow spectral linewidth of ~14 meV for samples grown at –500° C. at 5 K.

It is also seen, see inventors paper with Y-L. Chang et al entitled "Optimization of the Structural and Optical Quality of InN Nanowires on Si(111) by Molecular Beam Epitaxy" (J. Vac. Sci. Tech. B 28(3) May/June 2010, Paper C3B7), that the samples grown at a higher temperature, e.g. ~500° C., exhibits substantially higher, approximately a factor of 100, PL intensity, compared to that grown at lower temperatures suggesting that a higher crystal quality can be achieved at relatively high growth temperatures due to the increased adatom mobility and the resulting optimal bonding.

Figure 4L:
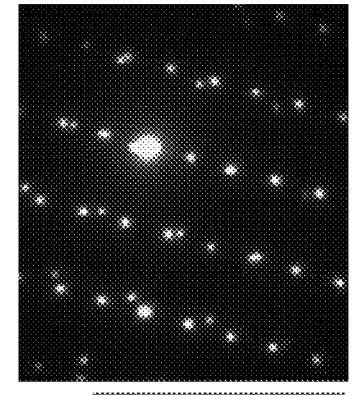
FIG. 4L shows a selected area electron diffraction measured for the InN nanowire and Si substrate interface of the nanowires within FIGS. 4A through 4K according to embodiments of the invention.

The structural properties of InN nanowires on Si were also studied by high resolution transmission electron microscopy (TEM). Shown in FIG. 4J is the TEM image of a non-tapered InN nanowire transferred on a carbon membrane on a TEM grid. It is evident that the nanowire is structurally uniform, with a constant diameter of ~71 nm along the wire of ~0.95 μm. By varying growth time, non-tapered InN nanowires with lengths in the range of 0.1 μm to 5 μm have been achieved. The high resolution TEM images and selected area electron diffraction patterns reveal that the wires exhibit a wurtzite crystal structure and have an interlunar spacing of 0.308 nm. Detailed studies confirm that the entire wire is of single crystal and relatively free of dislocations. It is also noted that no excess In droplets at the ends of the nanowires occur as evident from energy dispersive spectroscopy (EDS) measurements. This is due to the possible nitridation of the In droplets during and/or after the nanowire growth.

Figure 4K:
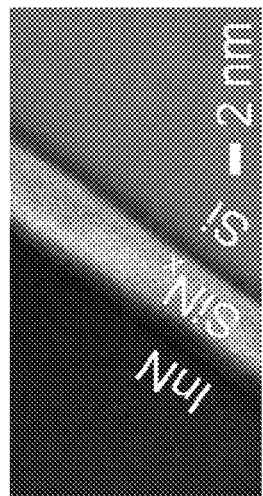
FIG. 4K shows a cross-sectional TEM image of InN/Si interface region for an InN nanowire grown on a silicon substrate according to an embodiment of the invention.
Figure 4J:
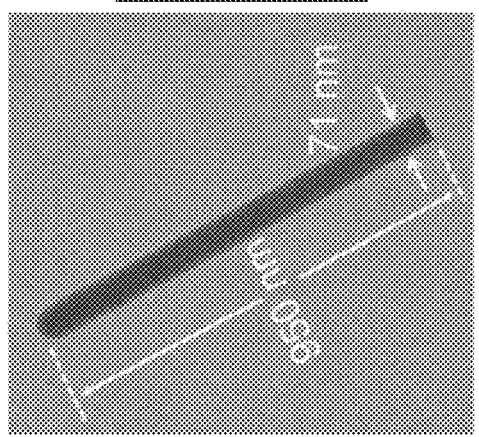
FIG. 4J shows an SEM micrograph of single InN nanowire grown according to an embodiment of the invention.

During the growth of InN on Si, an amorphous SiNx layer also develops at the misfit interface, which can be clearly identified from the cross-sectional TEM image of InN/Si interface region, shown in FIG. 4K. The presence of such an amorphous layer can severely limit the formation and properties of InN on Si. According to the prior art for thick (>2 nm-3 nm) SiNx amorphous layers, vertically oriented InN nanowires cannot be grown, see J. Grandal et al "Accommodation Mechanism of InN Nanocolumns Grown on Si (111) Substrates by Molecular Beam Epitaxy" (Appl. Phys. Lett., Vol. 91). With the use of an In seeding layer, however, single crystalline InN nanowires, that are relatively free of dislocations and stacking faults, can be achieved on Si even with the presence of a relatively thick (>4 nm-5 nm) SiNx layer, illustrated in FIG. 4K. The selected area electron diffraction measured for the InN nanowire and Si substrate interface region is shown in FIG. 4L, which consists of diffraction patterns for both the InN nanowire and the Si substrate. The perfect epitaxial alignment between Si(111) and InN(0001) is attributed to the pre-deposited In droplets, which act as seeds for the nucleation and growth of InN nanowires.

Figure 5A:
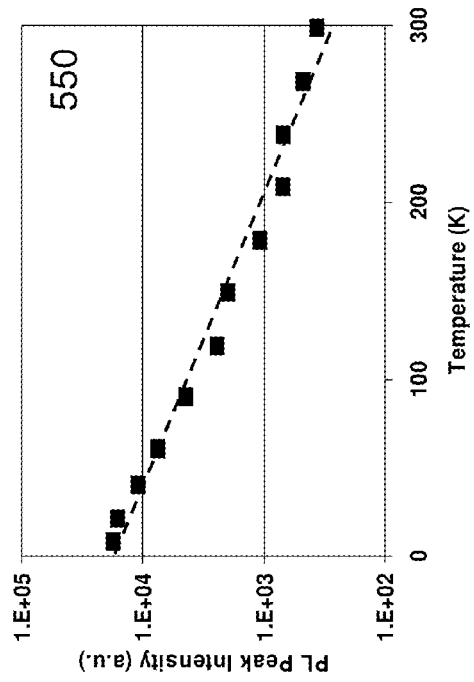
FIGS. 5A and 5B depict photoluminescence spectra and intensity versus temperature for InN nanowires grown according to an embodiment of the invention.

Referring to FIG. 5 the photoluminescence (PL) spectra 500 of InN nanowires grown without a foreign element catalyst were measured at 5 K and 300 K under excitation powers of 5 μW and 200 μW, respectively being shown as first curve 510 and second curve 520 respectively. The PL spectra are predominantly characterized by a single peak, and emission at higher energies is not observed. The measured spectral linewidths of 14 and 40 meV are significantly smaller than the commonly reported values of 60-120 meV for InN nanowire ensembles. The significantly reduced inhomogeneous broadening is attributed to the minimized, or completely eliminated, size variation along the wire axial direction and amongst the wires.

Figure 5B:
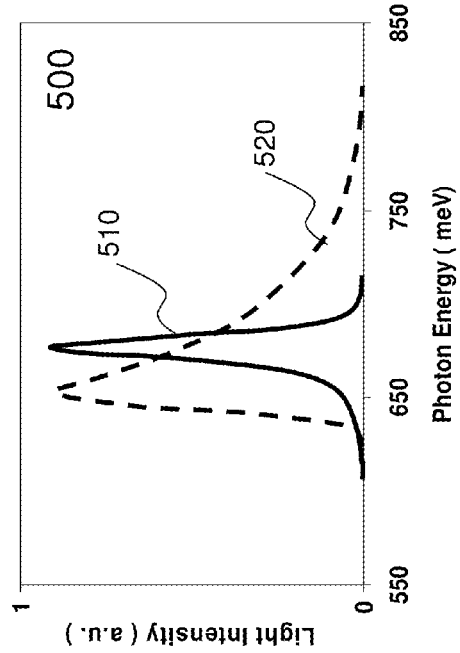

The PL spectra of conventional InN nanowires generally exhibit high energy tails that can be described by approximately $\exp(-E_{ph}/E_0)$ where $E_{ph}$ is the photon energy and $E_0$ is the specific energy corresponding to both the thermal distribution of carriers as well as the nanowire inhomogenity. The values of $E_0$ are typically smaller for nanowires with better quality. As evident from first curve 510 in FIG. 5 there is no high energy tail in the PL spectra at 5K, suggesting the high quality of non-tapered InN nanowires. Additionally, the high energy tail shown in the 300K PL spectrum, second curve 520 in FIG. 5, is characterized by a specific energy of $E_0 \approx 30$ meV which corresponds well to the thermal energy kT, further confirming the extreme homogeneity of the non-tapered nanowires grown according to embodiments of the invention. To evaluate the nonradiative recombination processes in InN nanowires the thermal quenching behavior of the PL emission was measured and is shown as quenching curve 550 in FIG. 5B under an excitation power of ~1.5 mW. The intensity decreases exponentially increasing temperature, with an activation energy of $E_a \approx 6.4$ meV over the temperature range of 5-300K. One of the major non-radiative recombination processes in InN is Auger recombination where recent studies suggested that Auger recombination in InN is a phonon assisted process, which is weakly dependent on temperature, with activation energy in the range of 4-9 meV, see D. Jang et al "Auger recombination in InN thin films" (Appl. Phys. Lett., Vol. 92). Therefore, the thermal quenching of PL emission can be well explained by non-radiative Auger recombination in InN nanowires.

Figure 6:
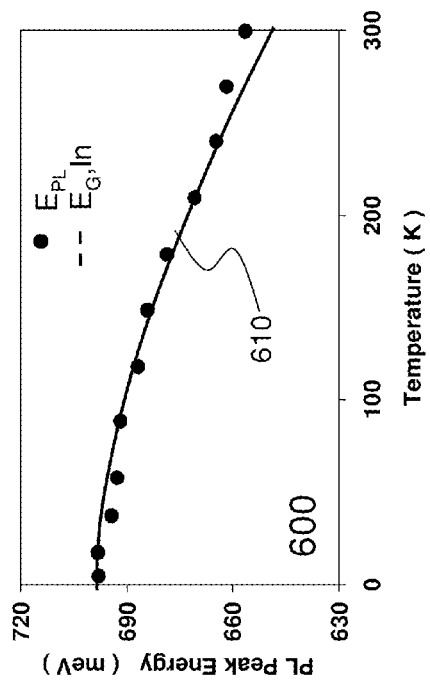
FIG. 6 depicts the variation of photoluminescence peak wavelength versus temperature for InN nanowires grown according to an embodiment of the invention.

One of the fundamental properties of InN, the direct band gap, is still a subject under debate. To date, the temperature dependence of the band gap has not been reliably obtained from InN nanowires, due to the large inhomogeneous broadening and very poor structural and optical quality. Shown in FIG. 6 is a graph 600 of the measured PL peak position of non-tapered InN nanowires grown according to an embodiment of the invention as a function of temperature under an excitation power of 1.5 mW. Solid line 610 plots the variation of the band gap of InN with temperature, calculated using the Varshni's equation $E_g(T)=E_h(0)-\gamma T^2/(T+\beta)$, where $E_g(0)$ =0.70 eV, $\gamma$=0.41 meVK$^{-1}$, and $\beta$=454K, see J. Wu et al "Superior Radiation Resistance of $In_{1-x}Ga_xN$ Alloys: a Full-Solar-Spectrum Photovoltaic Materials System" (J. Appl. Phys., Vol. 94). The agreement is excellent, which further confirms the extremely high quality and homogeneity of the non-tapered InN nanowires grown using an In seeding layer deposited during the InN nanowire growth process.

Figure 7:
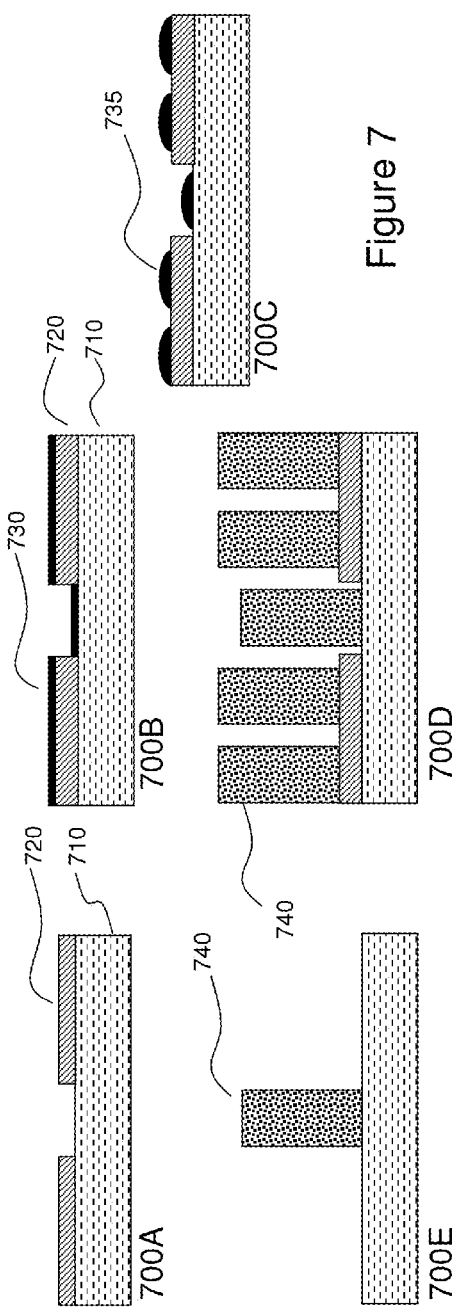
FIG. 7 depicts an exemplary process for growing InN nanowires according to an embodiment of the invention at predetermined locations upon a substrate.

Referring to FIG. 7 there is shown an embodiment of the invention for providing InN nanowires at predetermined locations upon a substrate 710. In first step 700A the substrate 710 has patterned a buffer material 720 that has been patterned with apertures where it is intended for InN nanowires to be formed. The buffer material should be capable of withstanding in situ oxide desorption at elevated temperatures (~770° C.) as described supra in respect of FIG. 3. Next at step 700B the substrate 710 and buffer material 720 are shown at an early stage within the growth process wherein the organometallic precursor trimethylindium, TMIn, is introduced without nitrogen forming an initial thin layer. As the thickness increases the In nucleates and forms liquid droplets 735 as shown in step 700C. The process continues as shown in step 700D, as presented supra in FIG. 3, with the introduction of the second precursor, ammonia, such that InN growth occurs and the InN nanowires 740 are formed where the In droplet 735 existed which as the thickness increases. The growth process is then terminated after the predetermined period of time such that the InN nanowires 740 are the required height. Subsequently the wafer is removed from the growth reactor and the buffer layer 720 is removed leaving free standing InN nanowires 740 where the openings within the buffer layer 720 existed.

Whilst the embodiments presented supra have been presented in respect of InN nanowires it would be evident to one skilled in the art that the principle applies to other group III-nitrides where the group III material nucleates and forms a liquid droplet upon the substrate during the initial phase of the nanowires growth where the nitrogen has not been admitted into the reaction chamber. These group III elements all form a wurtzite crystalline structure in their nitrides. Accordingly the invention applies to structures formed with GaN deposited onto the substrate as well as the previously described InN deposited onto the substrate. It would also be apparent to one skilled in the art that alternate approaches to patterning the nanowires are feasible without departing from the scope of the invention.

Figure 8:
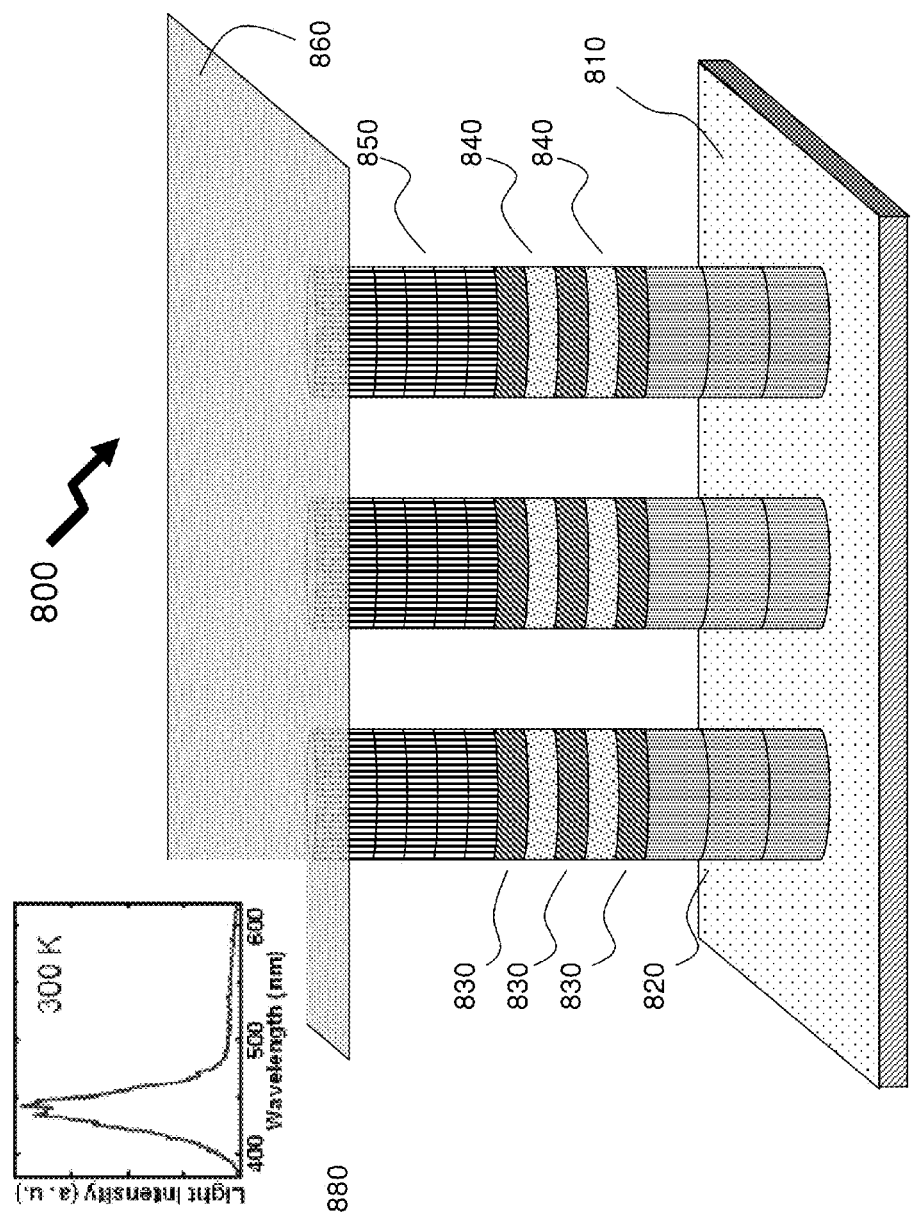
FIG. 8 depicts a nanowire based light source according to an embodiment of the invention.

Now referring to FIG. 8 there is depicted a nanowire light source 800 comprising InGaN/GaN well-in-a-wire nanowires LEDs formed according to embodiments of the invention. The substrate 810 for the nanowire light source 800 is an n-type silicon substrate upon which are grown 0.5 µm GaN nanowires doped with silicon to provide the lower n-type GaN material 820. The device active region consists of three InGaN quantum wells 830 separated by GaN spacers 840. Due to the growth methodology of the nanowires according to an embodiment of the invention as described supra in respect of FIGS. 3 to 7 these nanowires should exhibit negligible dislocations when compared to conventional InGaN/GaN quantum wells grown on silicon or sapphire substrates due to the highly effective stress relaxation. Atop the three InGaN/GaN quantum wells magnesium (Mg) doped GaN is grown to form the p-type GaN 850. The upper electrode for the InGaN/GaN well-in-a-wire nanowires LEDs forming the nanowires light source 800 is formed from indium tin oxide (ITO) 860, this being a transparent conductor. The nanowires light source 800 as fabricated and tested emits at 440 nm at 300K with high efficiency as evident from insert 880 showing the emission spectrum for such a GaN LED with InGaN/GaN quantum wells.

Figure 9:
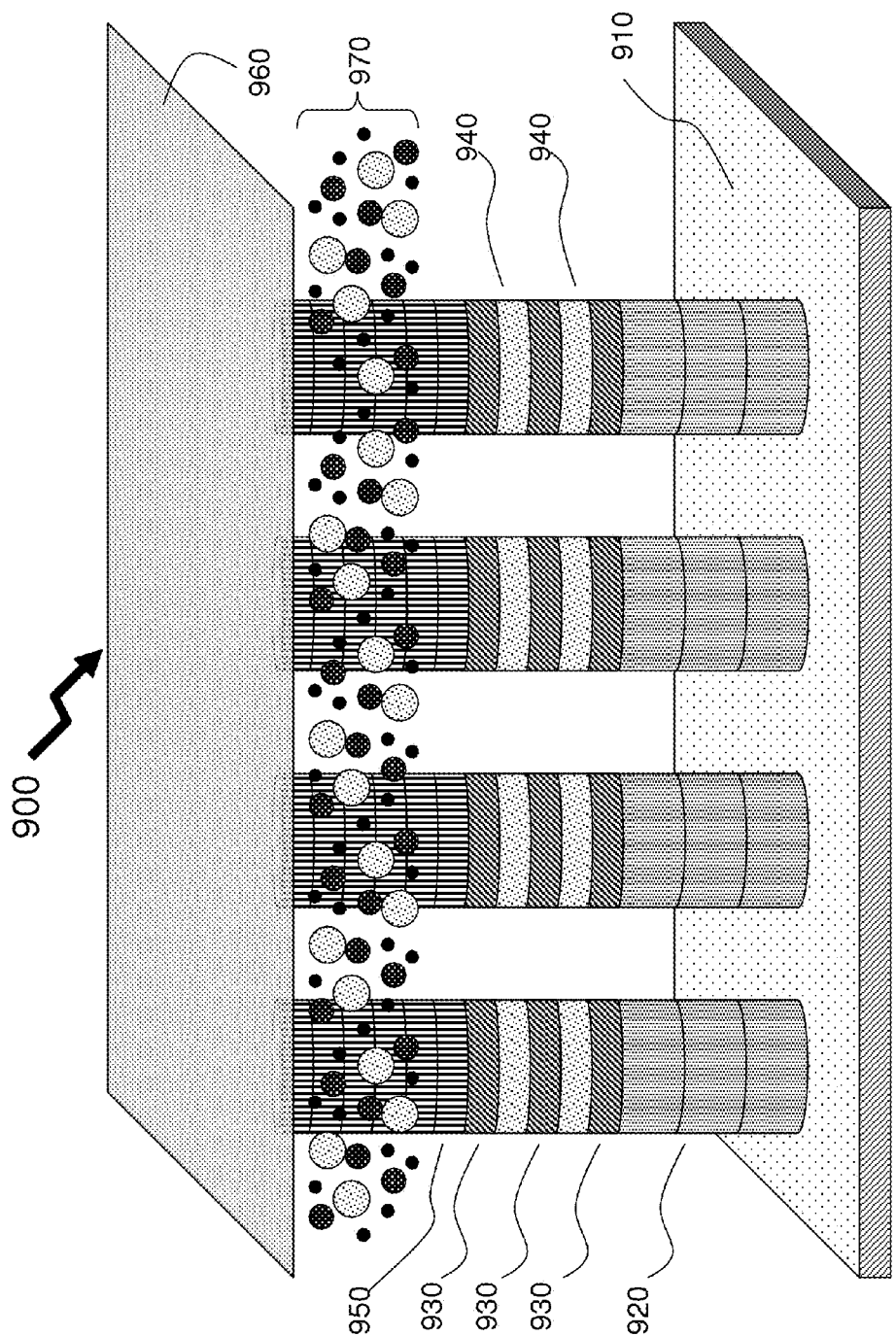
FIG. 9 depicts a nanowire and colloidal quantum dot based light source according to an embodiment of the invention.

FIG. 9 depicts a nanowire dot source 900 according to an embodiment of the invention. In common with nanowire light source 800 the substrate 910 is an n-type silicon substrate upon which are grown 0.5 µm GaN nanowires doped with silicon to provide the lower n-type GaN material 920. The device active region consists of three InGaN quantum wells 930 separated by GaN spacers 940. Atop the three InGaN/GaN quantum wells magnesium (Mg) doped GaN is grown to form the p-type GaN 850. Due to the growth methodology of the nanowires according to an embodiment of the invention as described supra in respect of FIGS. 3 to 7 these nanowires should exhibit negligible dislocations when compared to conventional InGaN/GaN quantum wells grown on silicon or sapphire substrates due to the highly effective stress relaxation.

Next colloidal quantum dots 970 have been spin-coated onto the surface after a planarization process to infill around the nanowires. The upper surfaces of the nanowires are then exposed using a selective etching process followed by the deposition of the ITO upper contact 960. As the colloidal quantum dots 970 largely reside above the InGaN/GaN quantum well regions their presence does not affect significantly the current flow, contact resistance or recombination process within the InGaN/GaN quantum well heterostructures. A portion of the emitted photons from the InGaN/GaN nanowires will be absorbed by the colloidal quantum dots 970 and "down converted" to photons with colours determined by the size and composition of the colloidal quantum dots 970.

For example the colloidal quantum dots may be CdS, CdSe, and CdTe to cover the blue/green/red portions of the visible spectrum. Some overlap of emission ranges occurs for example by size tuning the quantum dots, for example large CdS dots emit close to that of small CdSe dots. As taught by R. Cooney et al entitled "Gain Control in Semiconductor Quantum Dots via State-Resolved Optical Pumping" (Phys. Rev. Lett., Vol. 102, No. 12, 2009) at quantum dot diameters below 2.5 nm no optical gain had been demonstrated within the prior art thereby removing some of the expected value of confinement based tunability. However, R. Cooney et al demonstrated that optical gain in any quantum dot can be achieved if the quantum dots are pumped using state resolved optical pumping. Such state resolved optical pumping implying that potentially multiple InGaN/GaN quantum wire heterostructures may be required and/or the distribution of the colloidal quantum dots be controlled to ensure that dots requiring state resolved optical pumping have sources, be it the InGaN/GaN quantum wire heterostructures or other colloidal quantum dots.

It would be apparent to one skilled in the art that other energy transfer processes may occur, including Forster resonant energy transfer and Dexter electron transfer processes, and at small quantum dot—nanowire separations direct tunnel injection of carriers will occur, increasing efficiency.

Figure 10:
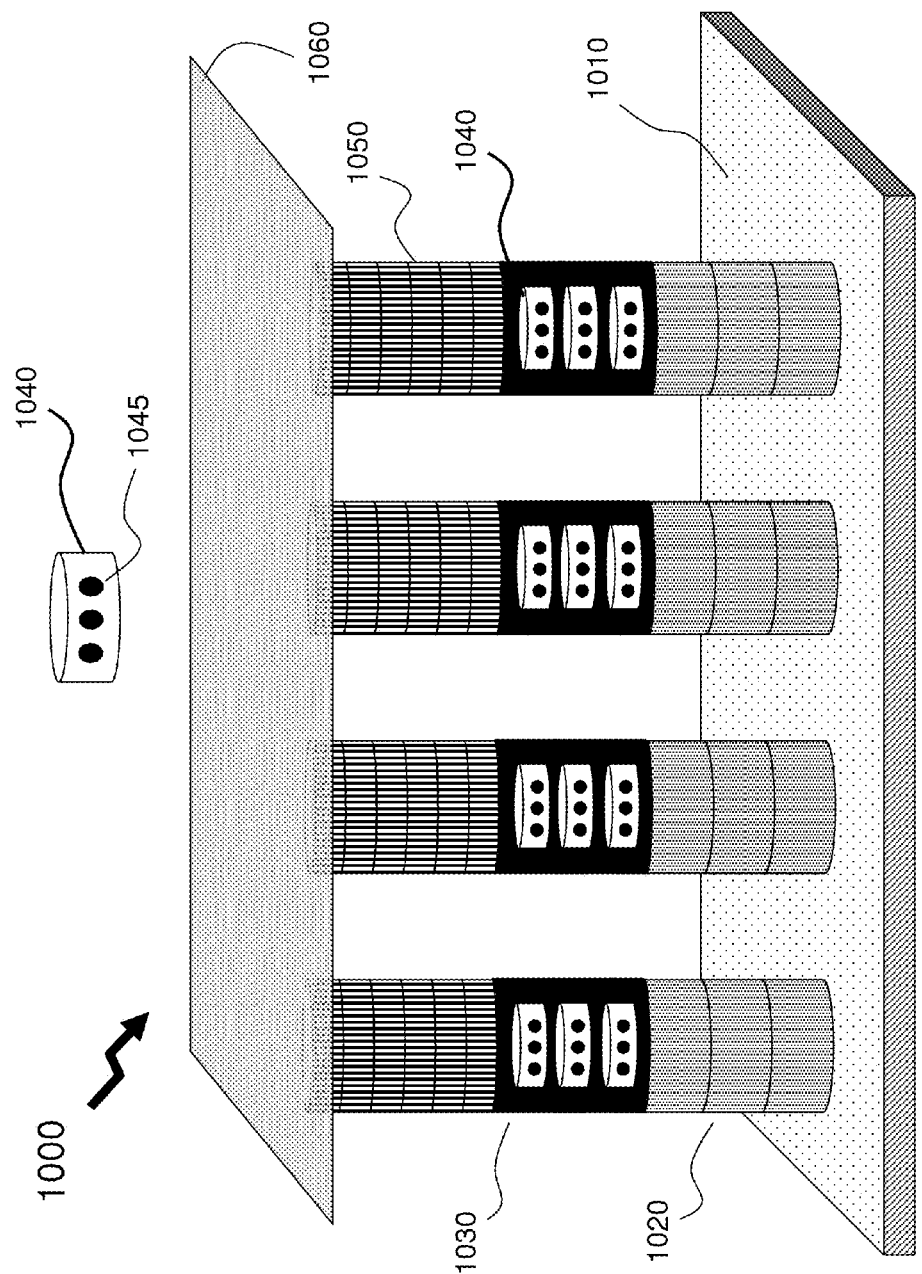
FIG. 10 depicts a nanowires light source employing nanowires featuring dot-within-a-dot-in-a-nanowire features for efficient optical sources according to an embodiment of the invention.

With the ability to form very high quality and uniform nanowires which are relatively defect free, as discussed supra in respect of FIGS. 3 through 7, it is feasible to consider growing so called dot-within-a-dot-in-a-nanowire heterostructures, employing quantum dots formed within the nanowires, for efficient photon generation. Such a dot-within-a-dot-in-a-nanowire light source 1000 is shown in FIG. 10 comprising a substrate 1010, for example n-type <111> silicon, upon which a GaN buffer 1020 is grown, followed by three vertically aligned large quantum dots 1040 within GaN barrier 1030, and a GaN capping layer 1050. An ITO electrode 1060 is formed on top of the GaN capping layer 1050 to provide the top electrode to the dot-within-a-dot-in-a-nanowire light source 1000. However, due to the very high quality, relatively defect free, and uniform growth provided by the invention within the quantum well and quantum dots localized In rich nanoclusters can form within each quantum dot as it is grown, thereby forming small quantum dots 1045 within each of the large quantum dots 1040. Such a dot-within-a-dot-in-a-nanowire has not been reported in the prior art and accordingly only feasible at this time using growth according to embodiments of the invention.

Such a dot-within-a-dot-in-a-nanowire heterostructure is shown in first SEM micrograph 1110. The InGaN/GaN dot-in-a-wire heterostructures consist of approximately 0.5 μm GaN buffer, three vertically aligned quantum dots separated by approximately 5 nm GaN barrier layers, and an approximately 0.3 μm GaN capping layer. The nanowire heterostructures were grown on silicon (<111>) substrates using a Veeco Gen II MBE system equipped with a radio frequency (RF) plasma source. According to this embodiment a thin layer of gallium is initially deposited forming nanoscale liquid droplets on the surface of the silicon wafer which form the nucleation sites for the growth of the GaN upon introduction of the ammonia precursor along with the trimethylgallium. Throughout the growth, the Ga flux and nitrogen flow rate were kept at approximately $5\times10^{-8}$ Torr and 1 sccm, respectively. The substrate temperature for GaN nanowires was approximately 800° C. which was lowered to approximately 550° C. during the growth of InGaN quantum dots. InGaN/GaN dot-within-a-dot-in-a-wire samples with different emission wavelengths were grown by varying the In/Ga flux ratios.

Figure 11:
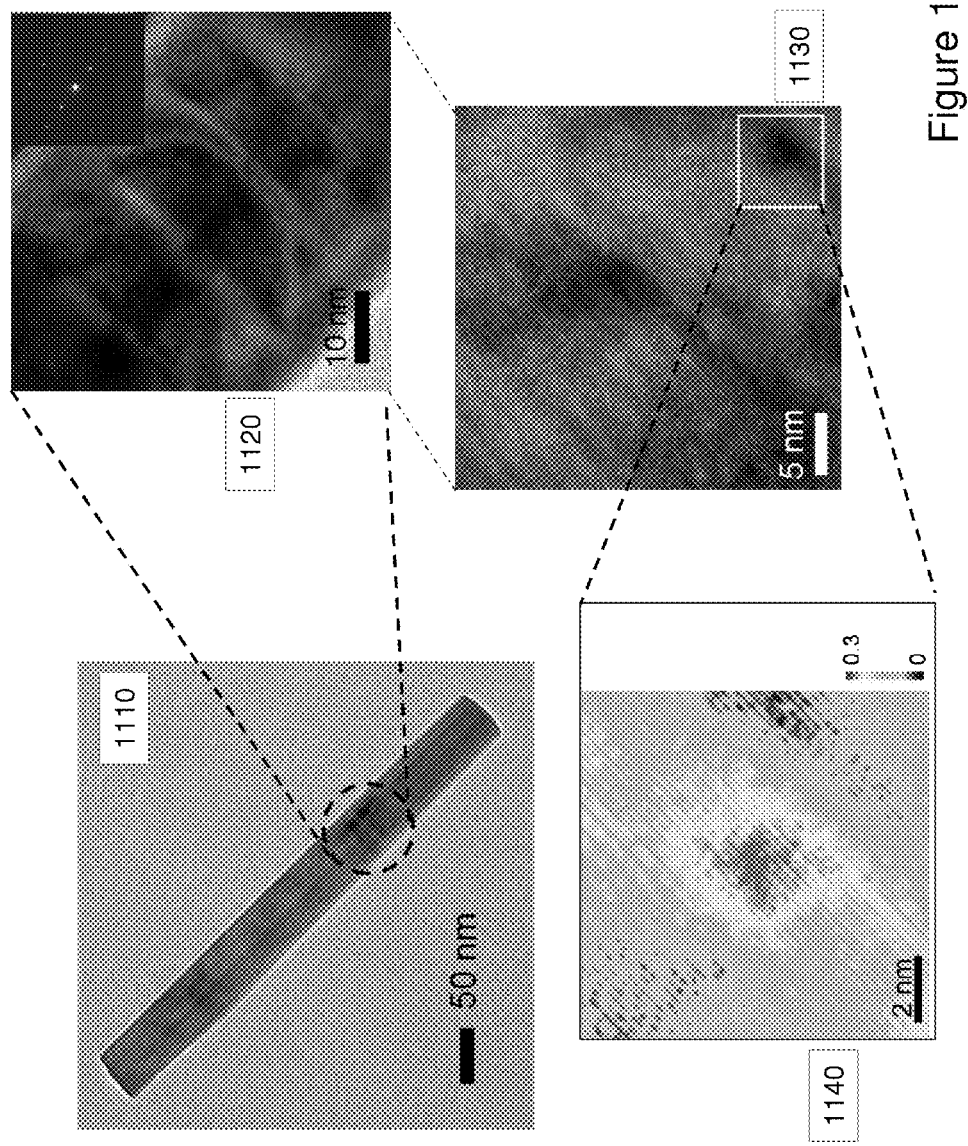
FIG. 11 depicts micrographs of a fabricated dot-within-a-dot-in-a-nanowire structure for a nanowires light source according to an embodiment of the invention.

It can be seen in first SEM micrograph 1110 that the nanowire as grown are vertically aligned and exhibit a diameter of approximately 50 nm. The nanowire densities can be varied from ~$1\times10^9$ to $1\times10^{10}$ cm$^{-2}$ by changing the growth temperature and N/Ga flux ratios. It can also be seen in first SEM micrograph 1110 that the vertically aligned InGaN quantum dots can be identified. The InGaN/GaN nanowire is structurally uniform with a length of ~0.8 μm. Also shown in FIG. 11 is high resolution TEM image 1120 for the quantum dot active region as highlighted in first SEM micrograph 1110 for the three vertically aligned InGaN quantum dots, which are located at the center of the wire, and have been formed by the strain-induced self-organization. They exhibit a height of ~7 nm and a width of ~30 nm, which are larger than the commonly reported values for InGaN/GaN quantum dots embedded in planar heterostructures, see K. Tachibana et al (IEEE J. Sel. Top. Quantum, Vol. 6, pp 475, 2000). The InGaN quantum dots and surrounding GaN barrier layers are nearly free of dislocations, due to the reduced strain distribution in the nanowire heterostructures grown according to an embodiment of the invention.

The average In compositions in the dots are estimated to be in the range of ~15 to ~25%, depending on the growth conditions, for green, yellow, and amber/red light emitting structures. It was also noted that a small amount (~6%) of In atoms are incorporated in the GaN barrier layers. Also shown in FIG. 11 is detailed TEM image 1130 which shows the presence of the In-rich nanoclusters, small quantum dots 1045, thereby leading to the unique dot-in-a-dot heterostructures which due to their close spacing may be electronically coupled. These In-rich nanoclusters are formed by phase segregation, and their sizes vary from ~2 nm to ~5 nm from measurements on dot-within-a-dot-in-a-nanowires grown under varying conditions according to the embodiments of the invention. Also shown in FIG. 11 is an In composition distribution profile 1140, derived from the Vegard's law, for the selected region in detailed TEM image 1130. This shows an In-rich nanocluster with an In composition of ~28% and dimensions of ~3.5 nm.

Figure 12:
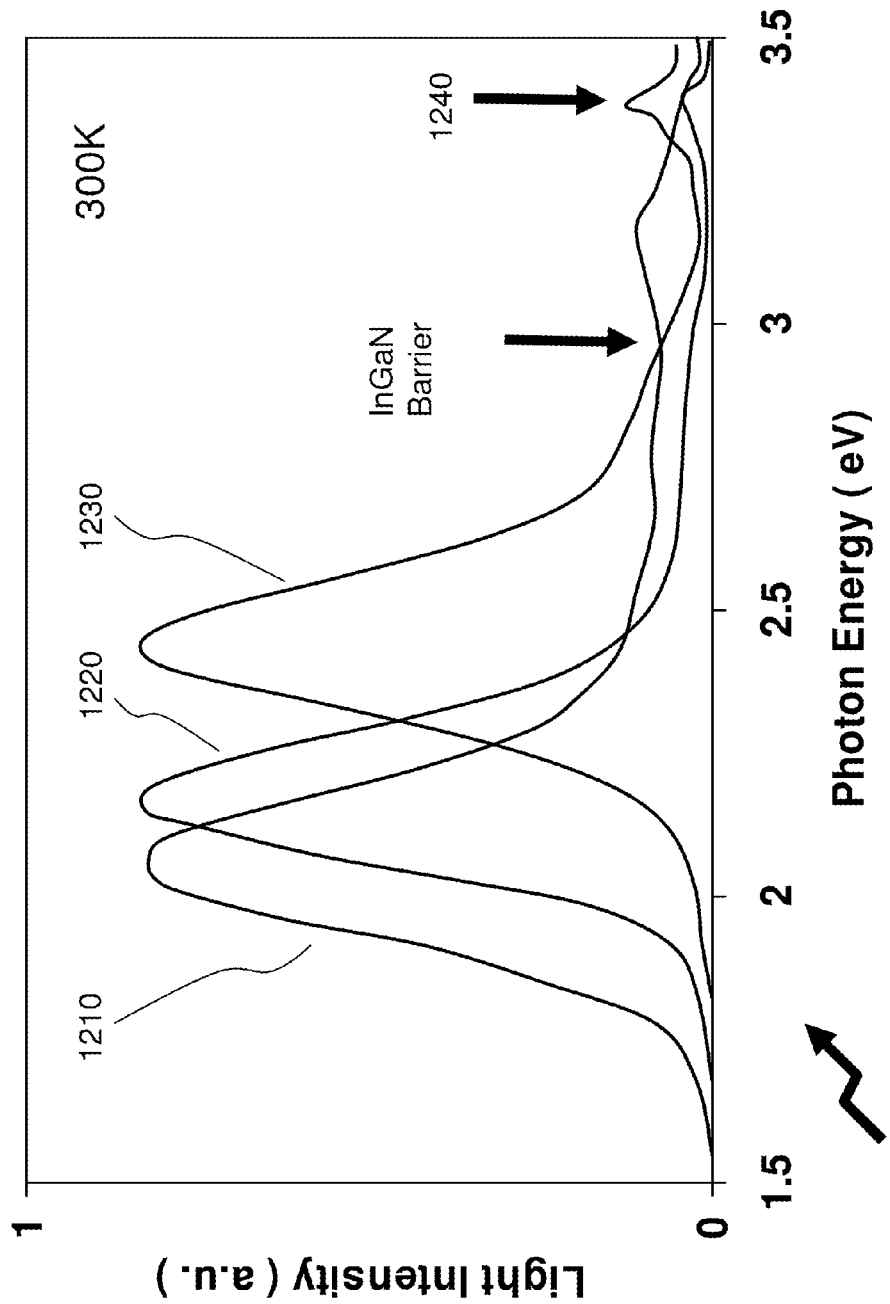
FIG. 12 depicts photoluminescence spectra for optical sources employing dot-within-a-dot-in-a-nanowire heterostructures with varying indium concentration according to embodiments of the invention.
Figure 13:
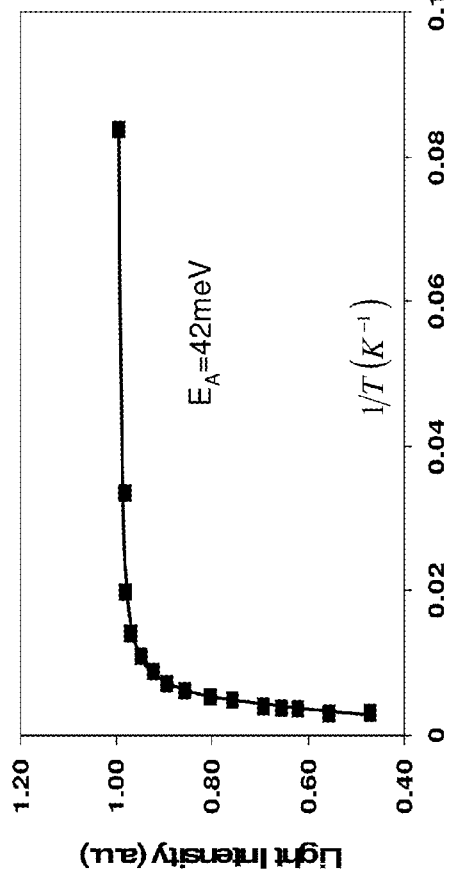
FIG. 13 depicts the variation of the integrated photoluminescence intensity with temperature for the yellow emitting InGaN/GaN dot-within-a-dot-in-a-nanowire heterostructures according to an embodiment of the invention.

Optical properties of InGaN/GaN dot-within-a-dot-in-a-nanowires nanoscale heterostructures were studied using temperature variable photoluminescence spectroscopy. FIG. 12 shows the normalized PL spectra 1200 measured under a pump power of ~100 W/cm$^2$ at room temperature for three InGaN/GaN dot-within-a-dot-in-a-nanowire heterostructures grown with different In/Ga flux ratios. The peak energy positions are at ~2.5 eV, ~2.2 eV, and ~2.0 eV, corresponding to green (~495 nm), yellow (~565 nm) and amber/red (~620 nm) emission, respectively. The measured spectral linewidths are in the range of ~200 meV to 260 meV. For all three samples, luminescence emission from the GaN nanowires themselves can also be observed as peak 1240 at ~3.4 eV (~365 nm) in FIG. 12. The intensity of this emission however is significantly smaller than that of the InGaN quantum dots, in spite of the thick GaN segments surrounding the dot layers. This further confirms the excellent optical quality of InGaN quantum dots. It may also be noted that a weak photoluminescence emission at ~3.0 eV (~415 nm) can also be measured, which is likely from the portion of surrounding GaN barrier layers that incorporates the small (~6%) amount of In atoms, due to phase segregation.

The variation of the integrated photoluminescence intensity versus temperature is shown in FIG. 1330 for the yellow emitting InGaN/GaN dot-within-a-dot-in-a-nanowire heterostructures ($\gamma_{pk}\approx2.2$ eV (565 nm) measured under a pump power of ~100 W/cm$^2$. By modeling the data using an Arrhenius plot, activation energy $E_A$~42 meV was derived based on the slope of the straight line in the high temperature range. The internal quantum efficiency at room temperature can be estimated by comparing the photoluminescence intensities measured at 300K and 10K respectively. Accordingly the InGaN/GaN dot-within-a-dot-in-a-nanowire heterostructures exhibit an internal quantum efficiency of ~45%, which is nearly a factor of 5 to 10 times larger than that measured in prior art InGaN ternary nanowires in the same wavelength range, see for example C. C. Hong et al (Optics. Exp., Vol. 17, 2009).

The emission mechanism of the unique InGaN/GaN dot-within-a-dot-in-a-nanowire heterostructures has also been investigated. Charge carriers are first incorporated in the vertically aligned InGaN quantum dots (large quantum dots 1040), which provides strong carrier confinement and therefore greatly reduce any nonradiative recombination associated with the nanowire surface states. The carriers subsequently drift to the localized deep potentials created by In-rich nanoclusters (small quantum dots 1045) and recombine radiatively. Further initial studies indicate that the large inhomogeneous broadening shown in the photoluminescence spectra is directly related to the size and compositional variations of these small quantum dots 1045 (I.e. the In-rich nanoclusters). The superior carrier confinement provided by both the self-organized InGaN quantum dots (large quantum dots 1040) and the In-rich nanoclusters (small quantum dots 1045) in conjunction with the nearly defect-free GaN nanowires grown according to an embodiment of the invention therefore explain the large internal quantum efficiency measured in the green, yellow, and amber/red wavelength ranges that was not previously possible using either InGaN nanowires, planar InGaN/GaN quantum dots, or well heterostructures according to the prior art.

Figure 14:
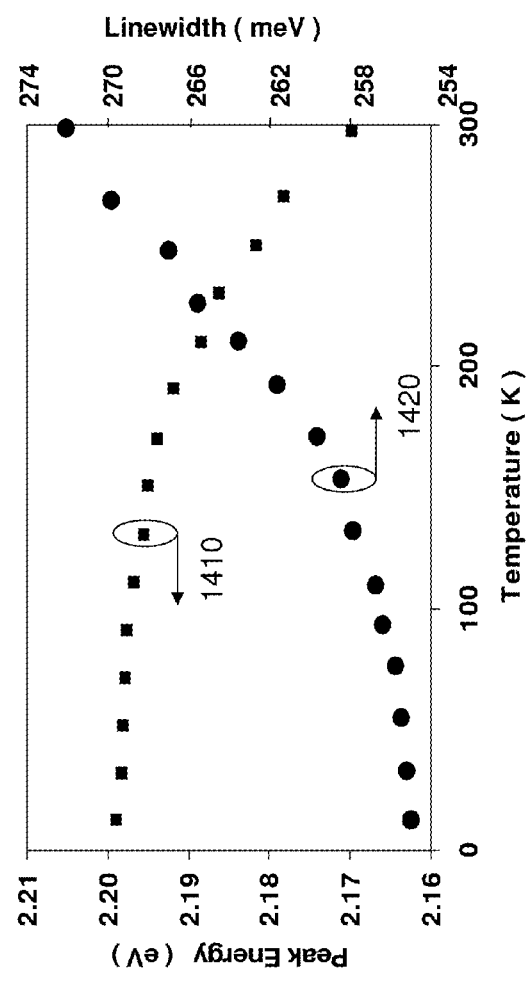
FIG. 14 depicts photoluminescence and spectral linewidth versus temperature for a yellow optical source employing nanowires with dot-within-a-dot-in-a-nanowire features.

Further studies further indicate that these small quantum dots 1045 (In-rich nanoclusters) within the large quantum dots 1040 are electronically coupled. Shown in FIG. 14 is the variation of the photoluminescence peak energy 1410 and spectral linewidth 1420 measured for the yellow emitting InGaN/GaN dot-within-a-dot-in-a-nanowire heterostructure. It is seen that the photoluminescence peak energy 1420 decreases monotonically with the increase of temperature from 10K to 300K. The "S" shaped behavior, i.e. the initial increase of the peak energy with the increase of temperature, commonly observed for InGaN/GaN quantum wells and InGaN nanowires, see for example C. C. Hong et al (Optics. Exp., Vol. 17, 2009), due to the presence of localized states in the tail density of states, is absent in the InGaN/GaN dot-within-a-dot-in-a-nanowire heterostructures grown according to an embodiment of the invention. The unique carrier dynamics of emitting InGaN/GaN dot-within-a-dot-in-a-nanowire heterostructure can be well explained, if the small quantum dots 1045 in the large quantum dots 1040 are electronically coupled. Under this condition, they can be modeled as 3-dimensional superlattices with discrete energy levels such that confined carriers will relax into the lower energy states before recombining, since the InGaN/GaN dot-within-a-dot-in-a-nanowire heterostructures are nearly free of dislocations. It is therefore expected that the photoluminescence peak energy follows the typical temperature dependence of the energy bandgap, instead of the anomalous "S" shaped behavior. The equilibrium carrier distribution in a single wire is also evidenced by the variation of the spectral linewidth 1420 with temperature, shown in FIG. 14, which displays a small increase with the increase of temperature, due to phonon scattering.

To date, the realization of InN nanowire solar cells, as well as many other semiconductor devices, has been further limited by the difficulty in achieving p-type doping. In this regard, Mg-doped InN films and the formation of p-type carriers have been investigated both theoretically and experimentally, see for example J. H. Song et al in "Stabilization of Bulk p-Type and Surface n-Type Carriers in Mg-Doped InN {0001} Films" (Phys. Rev. Lett., Vol. 101, p. 186801). A Fermi level shift toward the valence band was measured in InN:Mg layers, see. Kudrawiec et al in "Photoreflectance of InN and InN:Mg Layers—Evidence of a Fermi Level Shift Toward the Valence band upon Mg Doping in InN" (Appl. Phys. Lett., Vol. 93, p 131917), and the possibility of p-type doping has also been further suggested by electrolyte capacitance-voltage measurements. In order to compensate the presence of large electron densities of nominally non-doped InN as well as the associated surface electron accumulation, a relatively high concentration of Mg dopant is required, which, however, may lead to the formation Mg-related, donor like defects. Additionally, the growth and characterization of InN:Mg nanowires, to the best knowledge of the inventors, has not been reported. It has been observed that the incorporation of Mg can significantly affect the formation and structural properties of GaN nanowires, see for example F. Furtmayr et al in 'Nucleation and Growth of GaN Nanorods on Si {111} Surfaces by Plasma Assisted Molecular Beam Epitaxy—The Influence of Si and Mg Doping" (J. Appl. Phys. Lett., Vol 104, p 034309). The presence of Mg can greatly reduce the nanowire nucleation time and enhance the growth rate on the nonpolar surfaces, thereby leading to wires with increased diameters and reduced lengths. Additionally deteriorated crystal structures have been reported in the prior art at relatively high Mg concentrations. It is therefore of tremendous importance to develop nearly intrinsic InN nanowires as well as InN nanowire p-n junctions, in order to exploit the full potential of InN for third generation photovoltaics.

Electronically pure InN nanowires were grown on Si(111) substrates by plasma-assisted MBE under nitrogen-rich conditions according to an embodiment of the invention using conditions as described supra in respect of FIGS. 4A through 4D. Important for practical device applications such as optical sources, solar cells, etc is a precise control of the carrier concentration and conductivity of InN nanowires. The residual electron density of InN can be derived from a Hall-effect measurement or by analyzing the photoluminescence spectral linewidth measured at low temperatures. For conventional n-type degenerate InN, the measured photoluminescence linewidths are generally in the range of 50 to 100 meV, which correspond to residual electron densities of ~1018 cm-3, or higher. Photoluminescence spectra for non-tapered InN nanowires measured under various laser powers at 5 K resulting in an extremely narrow spectral linewidth of 8 meV under low excitation conditions. Detailed analysis revealed that the electron density in the undoped InN nanowires was ~2×10+15 cm-3, or less, which is nearly a factor of 500 times smaller than the commonly reported values, see for example T. Stoica in "Photoluminescence and Intrinsic Properties of MBE-grown InN Nanowires" (Nano. Lett., Vol. 6, pp. 1541-1547), suggesting for the first time that nearly intrinsic InN has been achieved, see also Y-L. Chang et al in "Photoluminescence Properties of Nearly Intrinsic Single InN Nanowire" (Adv. Funct. Mater, 2010, Vol. XX, pp 1-6).

With the achievement of nearly intrinsic InN nanowires, the inventors have investigated the growth and optical properties of Si- and Mg-doped InN nanowires. These nanowires are grown by introducing the respective dopants during nanowire growth without any modifications to the previously described growth conditions. Due to the significantly enhanced In adatom surface migration and the preferred growth along the nanowire length direction, the resulting doping level is generally smaller, compared to that of planar heterostructures. The inventors believe that the local dopant fluctuation in the wires may also be negligible, due to the relatively large (>100 nm) wire diameters. For the Si doping concentrations considered (<~1×10+18 cm-3), no morphological changes to the InN nanowires were observed. However, the incorporation of Si-dopant can significantly modify the optical properties of InN nanowires. Referring to FIG. 15A there are shown the photoluminescence spectra of InN:Si nanowires measured at 5 K for various Si doping levels.

As shown first curve 1510 represents the spectra for Si doping at 1×10+18 cm-3 magnified 22 times, second curve 1520 for 2×10+17 cm-3 magnified 15 times, third curve 1530 for 5×10+16 cm-3 magnified 3 times, and 1540 for non-doped nanowires without scaling, all measurements being made at 5K. It is seen that, with increasing Si-doping concentration, the InN nanowires exhibit a considerable blue shift in the photoluminescence peak energy, a drastic increase in the spectral linewidth, and a significant decrease in the luminescence efficiency Now considering Mg doping then it was determined from photoluminescence measurements of InN:Mg films, it was determined that the Mg acceptor activation energy was about 61 meV, see X. Q. Wang et al in "Growth and Properties of Mg-Doped In-Polar InN Films" (Appl. Phys. Lett., Vol. 90, p 201913). However, to the best of the inventors' knowledge, the growth and properties of InN:Mg nanowires have not been reported. In this study, InN:Mg nanowires, with Mg effusion cell temperatures varying from 185° C. to 235° C., were grown and characterized. It was observed that, for relatively low Mg concentrations, InN nanowires with excellent surface morphology and structural properties were obtained but that with increasing Mg flux, the wires showed increasing diameter and reducing length, potentially due to the reduced adatom surface migration. A further increase of the Mg concentration generally led to an onset of tapered surface morphology, with decreasing width with growth time, and the generation of dislocations Referring to FIG. 15B there are shown photoluminescence spectra for InN:Mg nanowires measured at 5K for various Mg effusion cell temperatures. It is observed that the photoluminescence peak intensity decreases considerably with increasing Mg incorporation, which may be directly related to the formation of Mg-related defects. First curve 1550 representing an effusion cell temperature of 185° C., second curve 1560 an effusion cell temperature of 215° C., and third curve an effusion cell temperature of 235° C. Second and third curves 1560 and 1570 being magnified by 8 and 10 times respectively.

Figure 16:
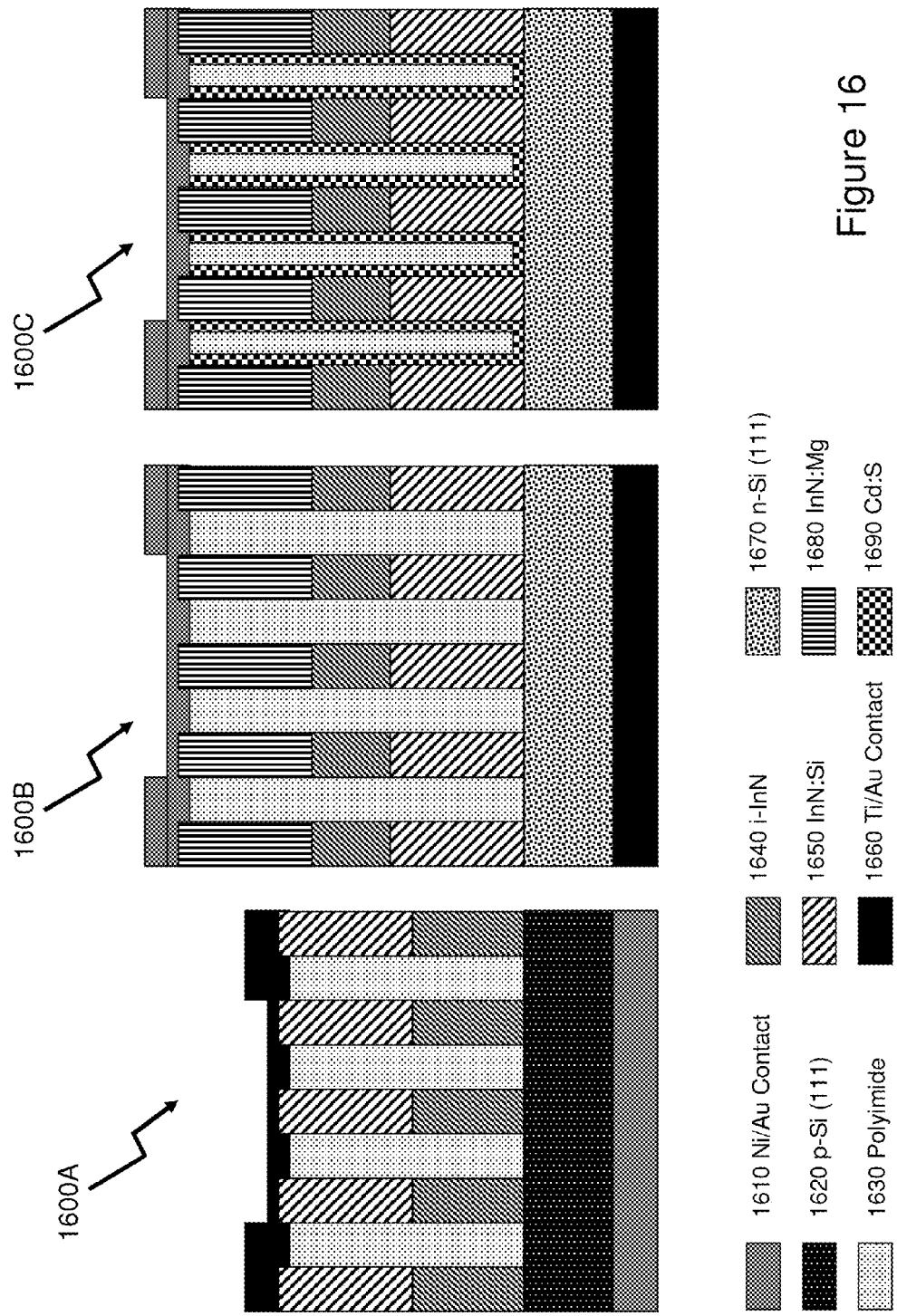
FIG. 16 depicts schematic designs for InN nanowire solar cells according to embodiments of the invention.

Referring to FIG. 16 there are depicted schematic designs for three InN nanowire solar cells according to embodiments of the invention. First solar cell 1600A the InN nanowire solar cells consist of 0.3 μm non-doped (intrinsic) InN 1640 with 0.4 μm Si-doped InN 1650 sections, which are grown directly on p-type Si(111) 1620 substrate. The InN nanowires are separated by polyimide 1630, and first solar cell 1600A having lower contact of Ni/Au 1610 and top contact Ti/Au 1660. Such a design does not require the use of p-type InN nanowires, which had not been demonstrated prior to the invention described in this specification, but could not be implemented through poor morphology, varying nanowire height, etc. Second and third solar cells 1600B and 1600C respectively employ InN p-i-n axial homojunctions which comprise of ~0.8 μM InN:Si 1650, 0.2 μm non-doped InN (intrinsic) 1640, and 0.3 μm InN:Mg 1680 sections grown on n-type Si(111) 1670 substrates.

Compared to first solar cell 1600A these p-n junctions are formed within the InN nanowires. It may be noted that a small variation in the thicknesses of the device intrinsic regions i-InN 1640 may arise, which does not have any major impact on the device efficiency. Second and third solar cells employing Ni/Au 1610 upper contacts and Ti/Au 1660 contacts. In all solar cell designs the top/upper contact is approximately 15 nm thick. One of the primary limitations for semiconductor nanowire devices is the significant non-radiative carrier recombination associated with the presence of surface states, which can be greatly minimized by using core-shell or dot/well-in-a-wire nanoscale heterostructures, see Y. L. Chang et al in "High Efficiency Green, Yellow, and Amber Emission from InGaN/GaN Dot-in-a-Wire Heterostructures on Si (111)" (Appl. Phys. Lett., Vol. 96, p. 013106).

Accordingly third solar cell 1600C employs a CdS 1690 layer for passivation, this being a thin CdS layer coated onto the nanowire surface using a chemical bath deposition method at ~70° C., wherein the bath consists of CdCl2, NH4Cl, and NH4OH, with a molecular proportion of 2:20:20:200. The resulting CdS 1690 layer is nearly intrinsic and exhibits a very high resistivity (~10+6 Ohm cm). Such a passivation/buffer layer has been widely used in the fabrication of CuIn(Ga)Se2 solar cells and has led to the most efficient (~19.9%) thin film solar cells ever reported, see M. A. Conteras et al in "Progress Toward 20% Efficiency in Cu(In, Ca)Se-2 Polycrystalline Thin-Film Solar Cells" (Prog. Photovolt. Res. Appl., Vol. 7, pp 311-316). Growth conditions for the various nanowire samples have been carefully controlled to achieve high-quality InN nanowires with relatively large diameters (>150 nm) to effectively enhance the light absorption.

Figure 17B:
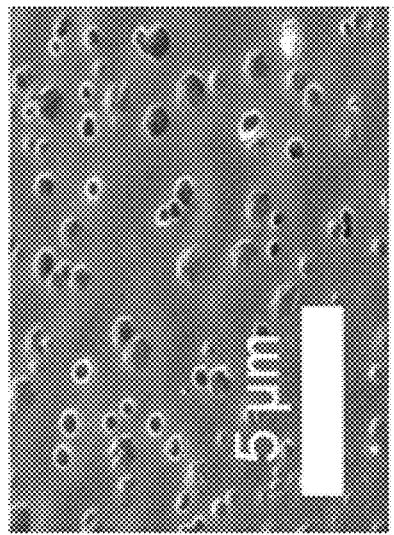
FIGS. 17A and 17B depict SEMs of the top surface of fabricated InN nanowire solar cells prior and subsequent to top metallization according to an embodiment of the invention.

The fabrication process for InN nanowire solar cells on Si according to second solar cell 1600B begins with a polyimide (PI) 1630 resist layer that is first spin-coated to fully cover the InN nanowires for surface planarization. The PI layer is subsequently etched using O2:CF4 (1:4) dry-etching until the top region of the wires is exposed, shown in FIG. 17A. The wafer is then flood-exposed with UV light and hard-baked at ~350° C. for ~30 minutes to cure the PI. The top exposed section of the wires is patterned, using standard photolithography, into cells of various sizes (0.09 mm2 up to 1.00 mm2) and, a thin Ni/Au 1610 (~5 nm/~10 nm) p-metal contact is deposited on the cell surface, as shown in FIG. 17B, which is followed by the deposition of thick Ni/Au metal contact layers at the periphery of the devices. Ti/Au 1660 (30 nm/150 nm) layers are then deposited on the backside of the n-Si 1670 substrate as the n-metal contact. The sample is annealed at 300-400° C. for 60 seconds.

Figure 18:
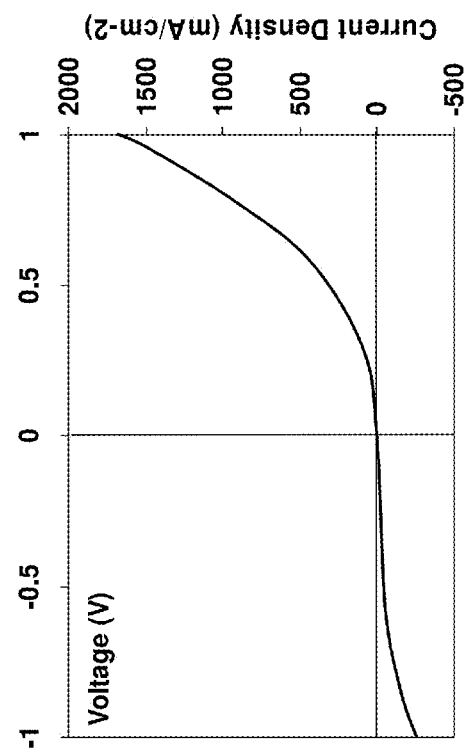
FIG. 18 depicts the dark I-V response for an InN:Si/i-InN nanowire device according to an embodiment of the invention.

Considering initially first solar cell 1600A, representing the prior art without the ability to implement p-type InN nanowires is described under dark and illumination, established as one-sun at AM 1.5G conditions, azimuth angle 48.2 degrees. First solar cell 1600A, the InN:Si/i-InN/p-Si heterojunction nanowire solar cells exhibit very poor diode characteristics, with rectifying ratios in the range of ~2 to ~4 measured at −0.5 V and 0.5 V as shown in FIG. 18. At −1V, a leakage current of more than 100 mA/cm2 was measured. As a consequence, no significant photo response was observed. The measured short-circuit current density and energy conversion efficiency were less than 2 mA/cm2 and 0.01%, respectively.

Figure 19A:
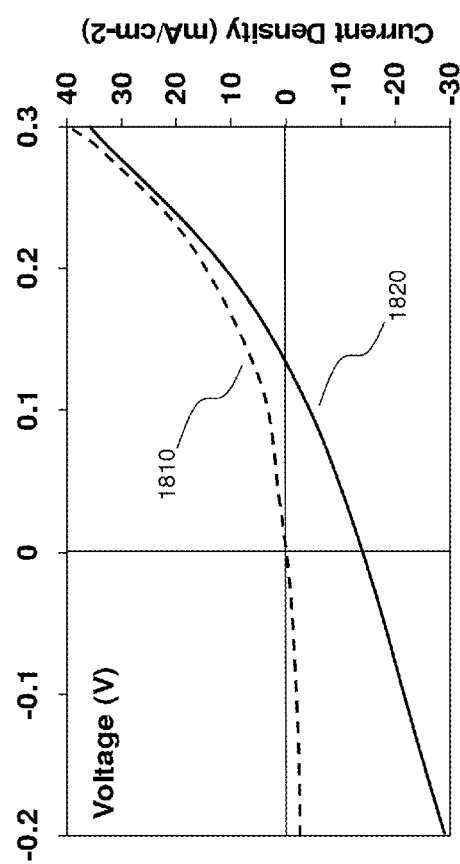
FIG. 19A depicts the I-V response for an InN; Mg/i-InN/InN:Si nanowire device according to an embodiment of the invention.
Figure 19B:
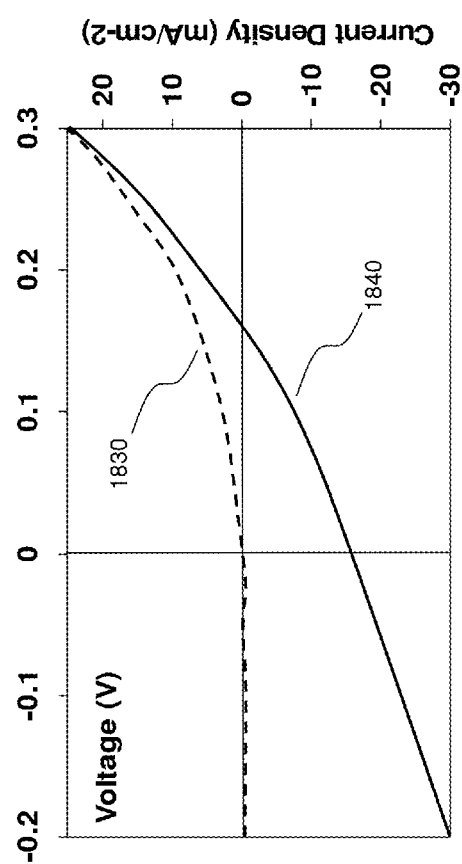
FIG. 19B depicts the I-V response for an InN:Mg/i-InN/InN:Si nanowire device with CdS passivation according to an embodiment of the invention.

Now referring to FIG. 19A there is shown the measured performance for second solar cell 1600B grown on n-type Si substrates. Under dark conditions, first curve 1910, the InN:Si/i-InN/InN:Mg nanowire device exhibits characteristics of a diode structure, with a significantly improved rectifying ratio (~60) measured at −1V and +1V, which is attributed to the built-in electric field in the p-i-n nanowire homojunction. In addition, a clear photoresponse is evident from second curve 1920 Under simulated AM 1.5G illumination, a short-circuit current density of ~12.9 mA/cm2 was obtained for a device area of 1 mm2. The measured open-circuit voltage, fill factor, and power conversion efficiency being ~0.13V, 30.2%, and 0.51%, respectively. The functioning of the InN p-i-n axial The performance of the afore-described InN:Si/iInN/InN:Mg nanowire homojunction solar cells, first and second solar cells 1600A and 1600B respectively may be limited by the presence of surface states, as discussed above which can be addressed, to a certain extent, with the use of CdS surface passivation. Illustrated in FIG. 19B there are the measured I-V curves under dark and illuminated conditions for the third solar cell 1600C, wherein a thin (~10 nm) CdS passivation-layer is incorporated. A reduction in the reverse leakage current and an improvement in the rectifying ratio (~150) were measured, compared to identical devices fabricated without the use of any CdS passivation, as evident from first curve 1930. The improved diode characteristics are attributed to the effective carrier confinement provided by the large bandgap CdS and the suppression of carrier leakage through the wire surface. Under one-sun (AM 1.5G) illumination, depicted by second curve 1940, the devices exhibit further improved performance, with a short-circuit current density of ~14.4 mA/cm2, open circuit voltage of 0.14 V, fill factor of 34.0%, and energy conversion efficiency of 0.68%. The measured short-circuit current densities are much larger than the commonly reported values for nanowire solar cells. The open-circuit voltage, whilst relatively low, can be improved by utilizing large bandgap InGaN nanowires and by optimizing the surface passivation and fabrication processes.

Figure 17A:
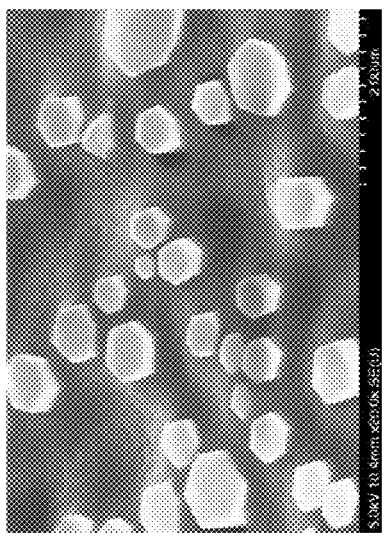

It would be evident to one of skill in the art that the performance of the InN nanowire solar cells may also be limited by the surface electron accumulation of n-type InN and the non-ideal carrier transport across the InN/Si misfit interface, due to the presence of a thin (~2-3 nm) amorphous SiNx layer, see H. P. T. Nguyen et al in "InN p-i-n Nanowire Solar Cells on Si" (J. Sel. Topic. Quant. Elect. Optionally improved device performance may be achieved utilizing core/shell heterostructures and by employing a planar GaN or InN buffer layer. Additionally, the energy conversion efficiency is currently limited by the low wire density, which as shown in FIG. 17A is a surface coverage of InN nanowires of less than 30%. As a result, a significant portion of the solar radiation cannot be absorbed by InN, and the benefit of light trapping associated with nanowires may be absent as well. Consequently, by optimizing the wire density and diameters, the energy conversion efficiency can be readily increased by a factor of 3, or larger.

Additionally the energy conversion efficiency will improve with InGaN nanowire solar cells with an optimized energy bandgap. Optionally the use of coalescent growth for a planar top contact layer would also greatly facilitate the device fabrication and reduce the series resistance.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A method comprising:
providing a first source of a plurality of sources, the first source of the plurality of sources for providing a source of a group III element;
providing a second source of the plurality of sources, the second source of the plurality of sources for providing a source of nitrogen;
providing a substrate within a reaction chamber, the reaction chamber comprising at least controllable inlets for at least the first and second sources of the plurality of sources;
establishing operation of the reaction chamber at a first predetermined set of operating conditions;
introducing the first source of the plurality of sources into the reaction chamber in the absence of the second source for a first predetermined period of time, the introduction being at least one of at a predetermined flow rate and predetermined pressure;
establishing operation of the reaction chamber at a second predetermined set of operating conditions after the predetermined period of time has elapsed;
introducing into the reaction chamber in addition to the first source of the plurality of sources at least the second source of the plurality of sources, each of the first and second sources of the plurality of sources being introduced at least one of at a predetermined flow rate and a predetermined pressure;
operating the reaction chamber at the second predetermined set of operating conditions for a second predetermined period of time.

2. A method according to claim 1 wherein,
the first predetermined set of operating conditions result in the formation of nanoscale droplets of the group III element on the surface of the substrate.

3. A method according to claim 1 wherein,
growth of the semiconductor comprising at least the group III element and nitrogen within the reaction chamber is initiated without the presence of a foreign catalyst.

4. A method according to claim 1 wherein,
the group III element is one of indium, gallium, and aluminum and the first predetermined set of operating conditions comprises at least one of establishing the reaction environment as nitrogen rich and establishing the substrate temperature within the range of 400° C. and 550° C. when the group III element is indium, within the range of 700° C. and 900° C. when the group III element is gallium, and within the range of 900° C. and 1200° C. when the group III element is aluminum.

5. A method according to claim 1 wherein,
the second predetermined set of operating conditions comprises at least one of establishing the reaction environment as nitrogen rich and the substrate temperature within the range 500° C. and 800° C. when the plurality of sources relate to the ternary semiconductor indium gallium nitride, 500° C. and 1200° C. when the plurality of sources relate to the ternary semiconductor indium aluminum nitride, and 500° C. and 1200° C. when the plurality of sources relate to the quaternary semiconductor indium gallium aluminum nitride.

6. A method according to claim 1 wherein,
operating the reaction chamber at the second predetermined set of operating conditions for a second predetermined period of time comprises performing a predetermined series of growth steps, each growth step characterized by at least a predetermined set of operating conditions for the reaction chamber, a predetermined time, and a predetermined set of conditions for the plurality of sources.

7. A method according to claim 6 wherein,
the resulting semiconductor growth comprises at least one of a nanowire, a quantum dot, a quantum well, a heterostructure, a p-i-n diode, and a quantum dot comprising nanoclusters characterized in a group III element composition higher than the surrounding quantum dot.

8. A method according to claim 1 wherein,
the substrate is silicon and the semiconductor comprising the group III element is grown in the presence of silicon nitride formation on the silicon.

9. A method according to claim 1 wherein,
the first source of the plurality of sources comprises at least one of the group III element and a precursor comprising at least the group III element and for providing the group III element in elemental form as the result of a reaction within the reaction chamber.

10. A method comprising:
initiating the growth of a wurtzite semiconductor onto a substrate, the initiation being achieved through providing nanoscale droplets of a group III element constituent of the wurtzite semiconductor on the surface of the substrate and absent both a foreign catalyst and other constituent elements of the wurtzite semiconductor.

11. A method according to claim 10 further comprising;
continuing the growth of the wurtzite semiconductor for a predetermined period of time;
growing a series of semiconductor materials in a predetermined sequence atop the wurtzite semiconductor.

12. A method according to claim 11 wherein,
the series of semiconductor materials comprise at least one of a quantum dot, a quantum well, a barrier, a heterostructure, a p-doped semiconductor, an intrinsic semiconductor, a n-type semiconductor, quantum dot comprising nanoclusters characterized in a group III element composition higher than that of the surrounding quantum dot, and a graded semiconductor grading from a first composition to a second composition.

* * * * *